(12) United States Patent
Chen et al.

(10) Patent No.: US 9,286,994 B1
(45) Date of Patent: Mar. 15, 2016

(54) METHOD OF REDUCING HOT ELECTRON INJECTION TYPE OF READ DISTURB IN DUMMY MEMORY CELLS

(71) Applicant: SanDisk Technologies Inc., Plano, TX (US)

(72) Inventors: Hong-Yan Chen, Sunnyvale, CA (US); Yingda Dong, San Jose, CA (US); Wei Zhao, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/669,247

(22) Filed: Mar. 26, 2015

Related U.S. Application Data

(60) Provisional application No. 62/107,911, filed on Jan. 26, 2015.

(51) Int. Cl.
  *G11C 16/04* (2006.01)
  *G11C 16/34* (2006.01)
  *G11C 16/26* (2006.01)

(52) U.S. Cl.
  CPC ........ *G11C 16/3427* (2013.01); *G11C 16/0466* (2013.01); *G11C 16/0483* (2013.01); *G11C 16/26* (2013.01)

(58) Field of Classification Search
  CPC . G11C 16/3418; G11C 16/0483; G11C 16/10
  USPC ............. 365/185.02, 185.05, 185.17, 185.18, 365/185.19
  IPC .......................... G11C 16/3418, 16/0483, 16/10
  See application file for complete search history.

(56) References Cited

U.S. PATENT DOCUMENTS

| | | | |
|---|---|---|---|
| 8,089,811 B2 | 1/2012 | Kang et al. | |
| 8,472,266 B2 | 6/2013 | Khandelwal et al. | |
| 8,670,285 B2 | 3/2014 | Dong et al. | |
| 8,867,271 B2 | 10/2014 | Li et al. | |
| 8,976,583 B2 | 3/2015 | Kim | |
| 2009/0268524 A1 | 10/2009 | Maejima | |
| 2015/0092491 A1* | 4/2015 | Senoo | G11C 16/16 365/185.11 |

OTHER PUBLICATIONS

U.S. Appl. No. 14/601,531, filed Jan. 21, 2015, to H. Chen et al. "Method of Reducing Hot Electron Injection Type of Read Disturb in Memory".
U.S. Appl. No. 14/612,601, filed Feb. 3, 2015, to L. Pang et al. "Adaptive Increase in Control Gate Voltage of a Dummy Memory Cell to Compensate for Inadvertent Programming".

\* cited by examiner

*Primary Examiner* — Connie Yoha
(74) *Attorney, Agent, or Firm* — Vierra Magen Marcus LLP

(57) ABSTRACT

Read disturb is reduced for dummy memory cells in a charge-trapping memory device such as a 3D memory device. The memory device includes a selected NAND string and an unselected NAND string. In the unselected NAND string, a dummy memory cell is adjacent to a select gate transistor. During a read operation involving the selected NAND string, a voltage of the dummy memory cell is increased in two steps to minimize a gradient in a channel of the unselected NAND string between the dummy memory cell and the select gate transistor. During the first step, the select gate transistor is conductive so that the channel is connected to a driven bit line. During the second step, the select gate transistor is non-conductive. Voltages on unselected word lines can also be increased in two steps to set a desired channel boosting level in the unselected NAND string.

20 Claims, 19 Drawing Sheets

Fig. 1C

Code in storage device (150)

boot code (151)

control code / set of instructions (160)

instructions to connect a channel of an unselected NAND string to a bit line while the bit line is at a driven voltage, the instructions to connect comprising instructions to step up a voltage on a select gate line, step up a voltage on a first dummy word line, and step up a voltage on unselected word lines (161);

instructions to, after the connecting, disconnect the channel of the unselected NAND string from the bit line, the instructions to disconnect comprising instructions to step down the voltage on the select gate line (162); and instructions to, while the channel of the unselected NAND string is disconnected from the bit line, further step up the voltage of the first dummy word line, and subsequently sense the selected memory cell while one or more voltages are provided on the selected word line (163).

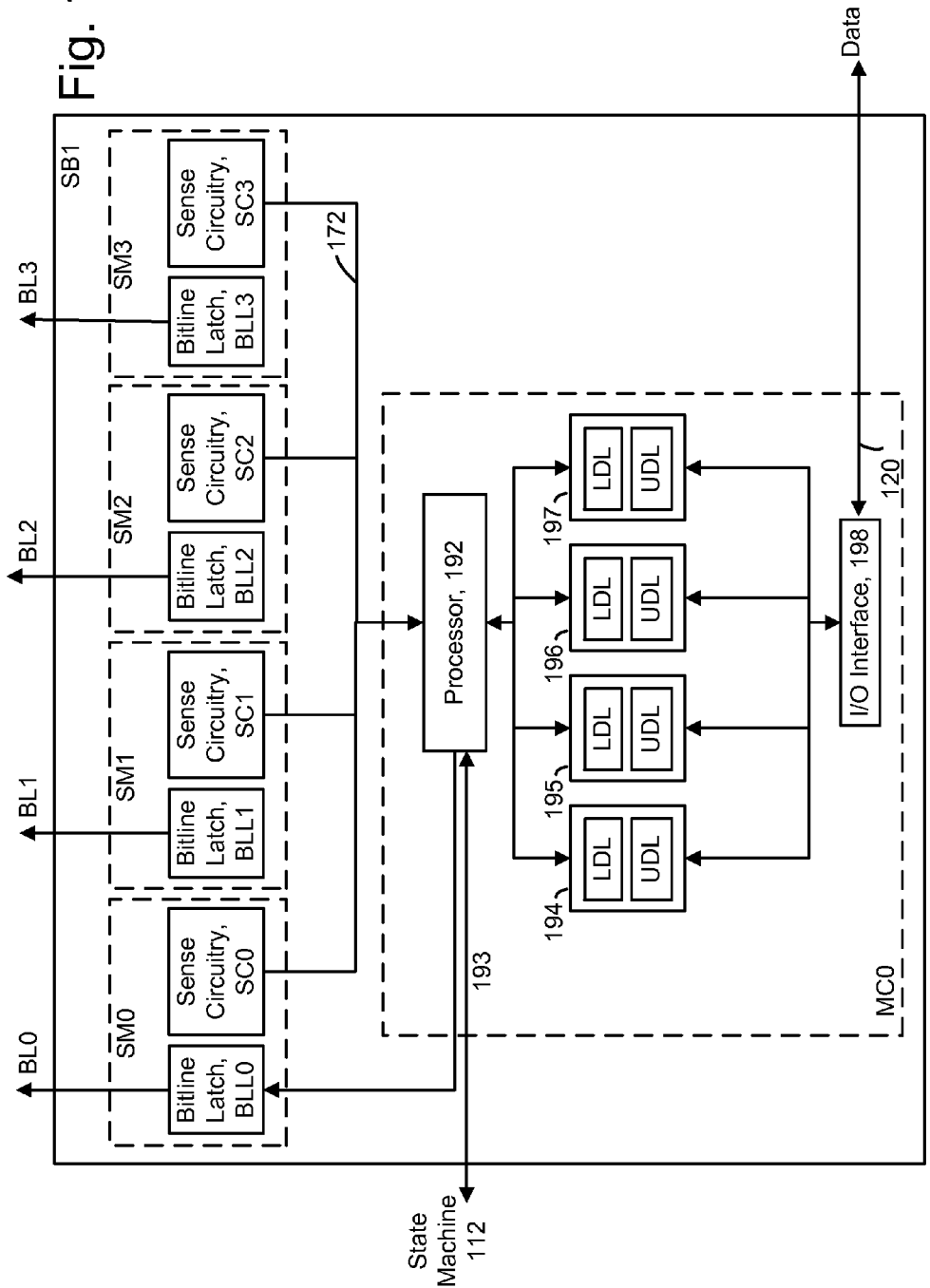

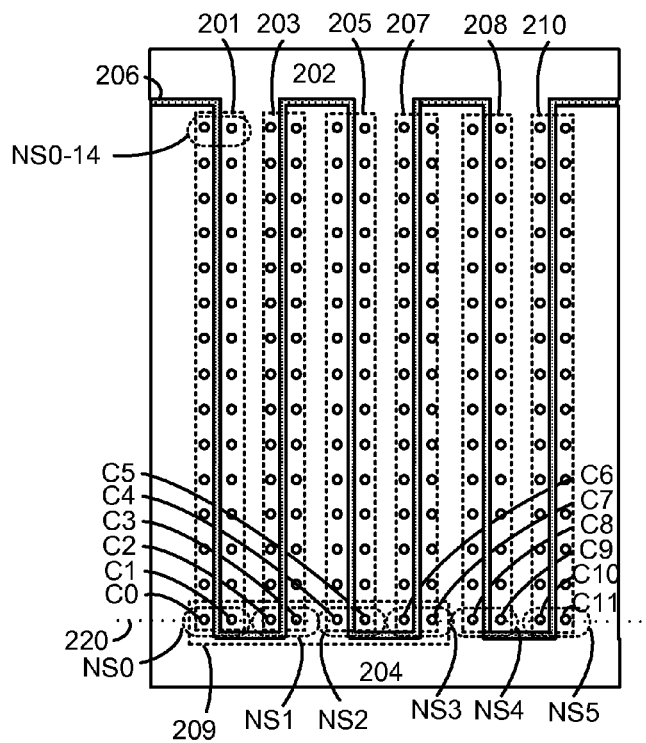
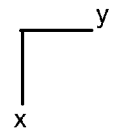
Fig. 2A
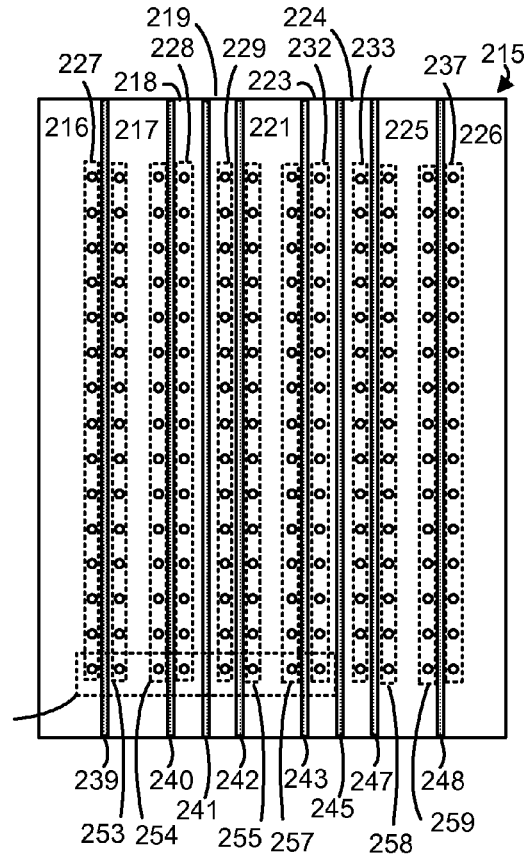
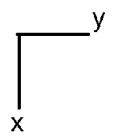
Fig. 2B

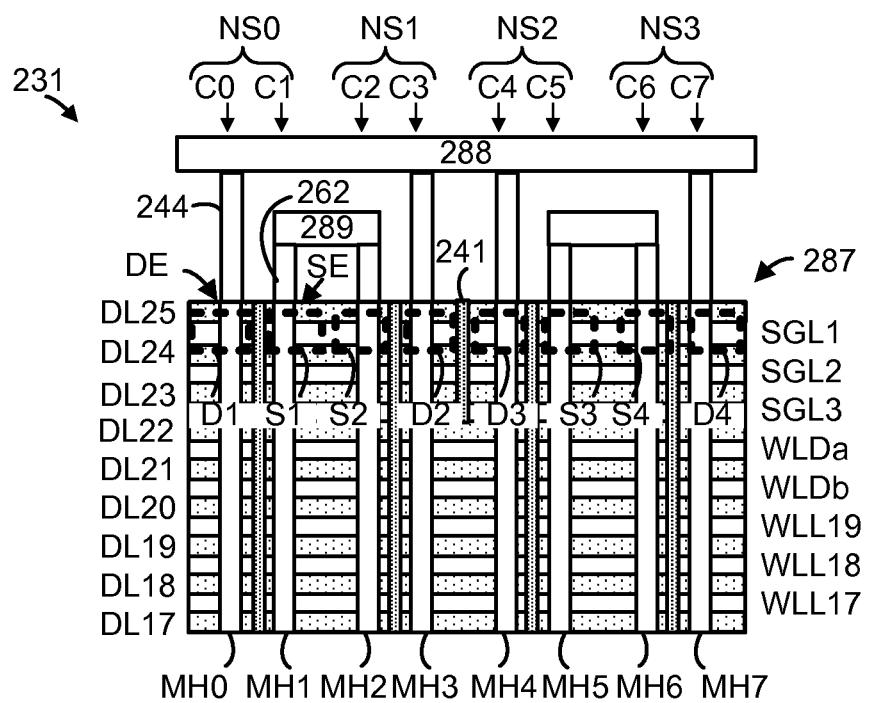
Fig. 2C
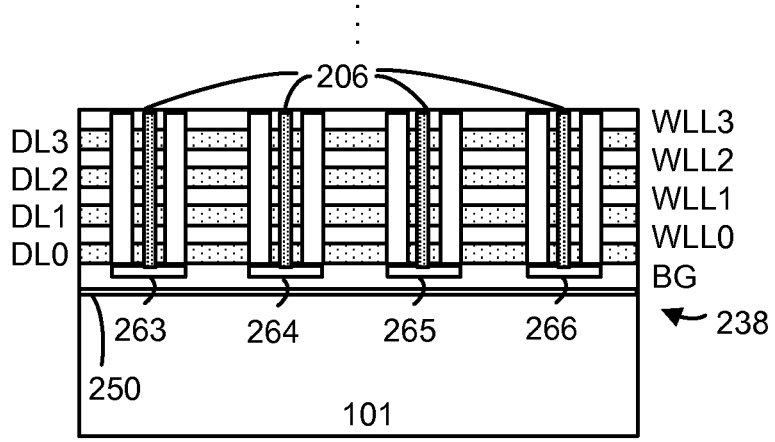

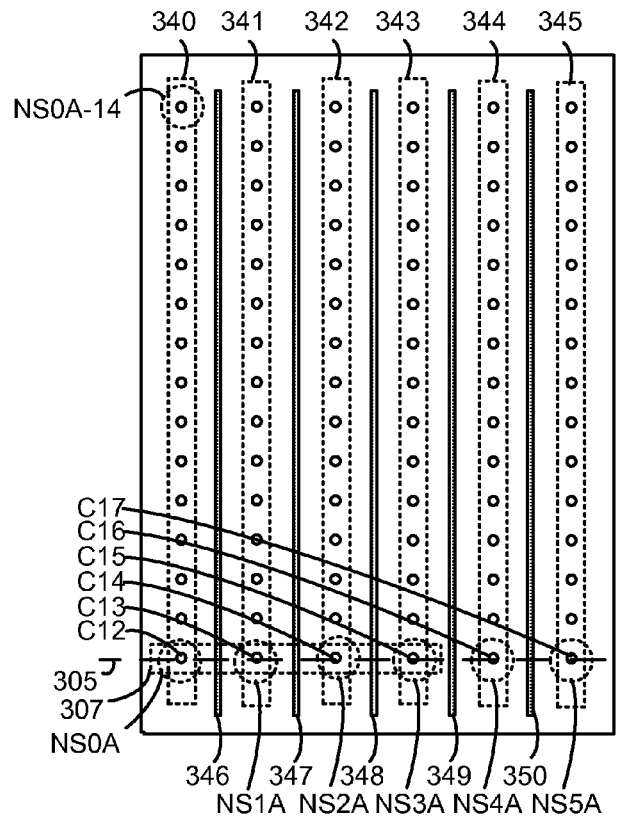
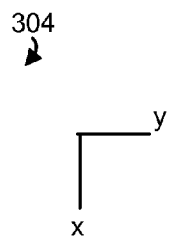
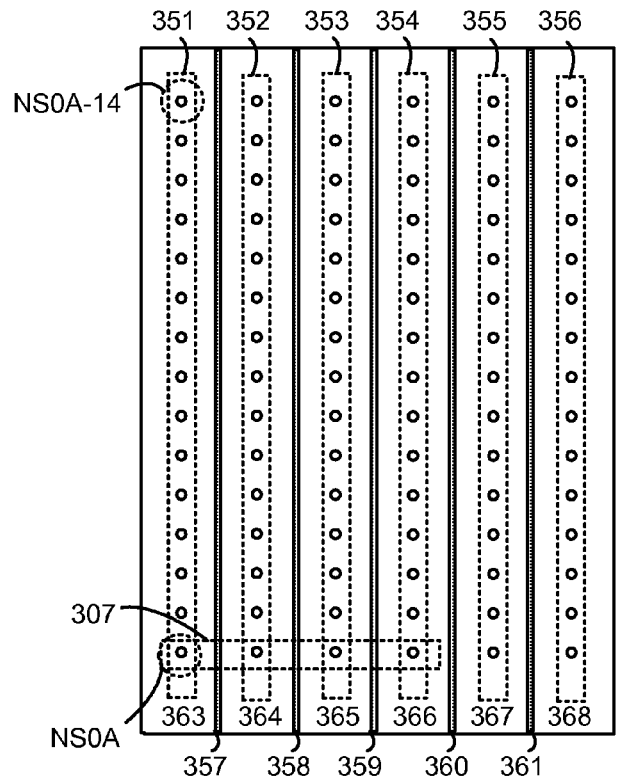
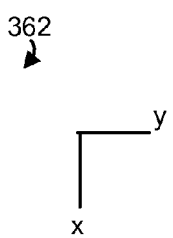

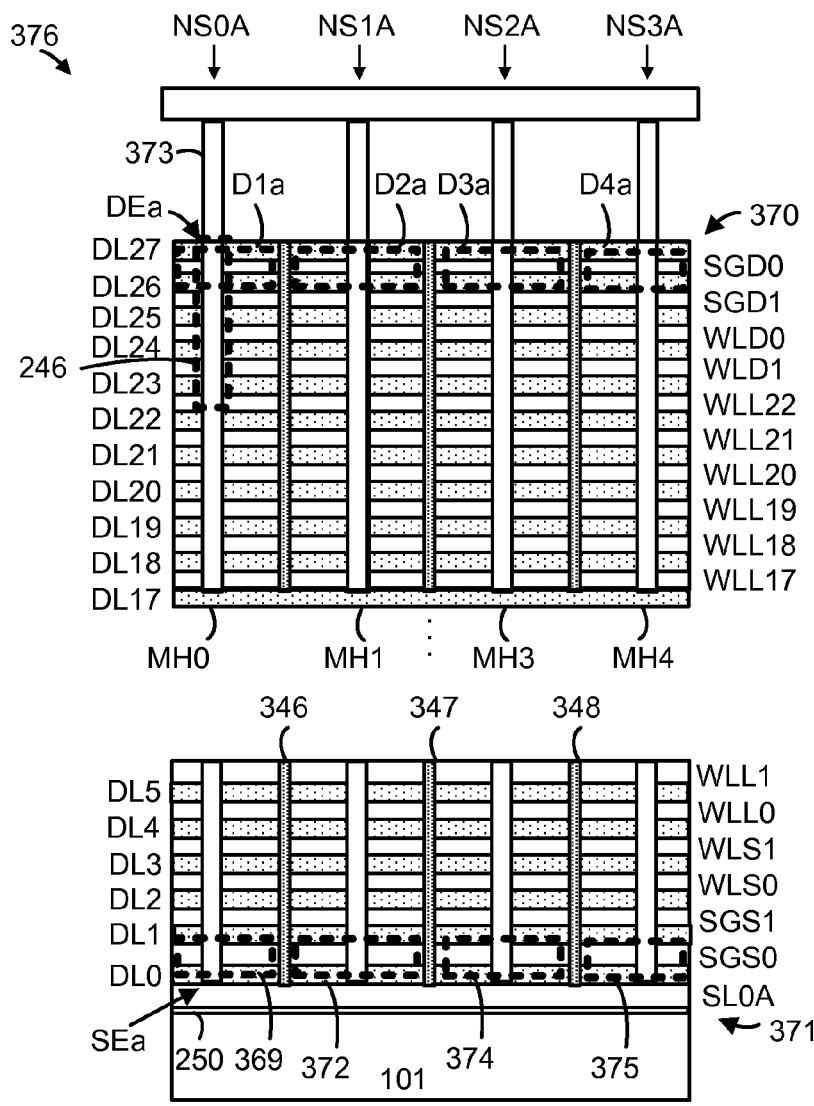

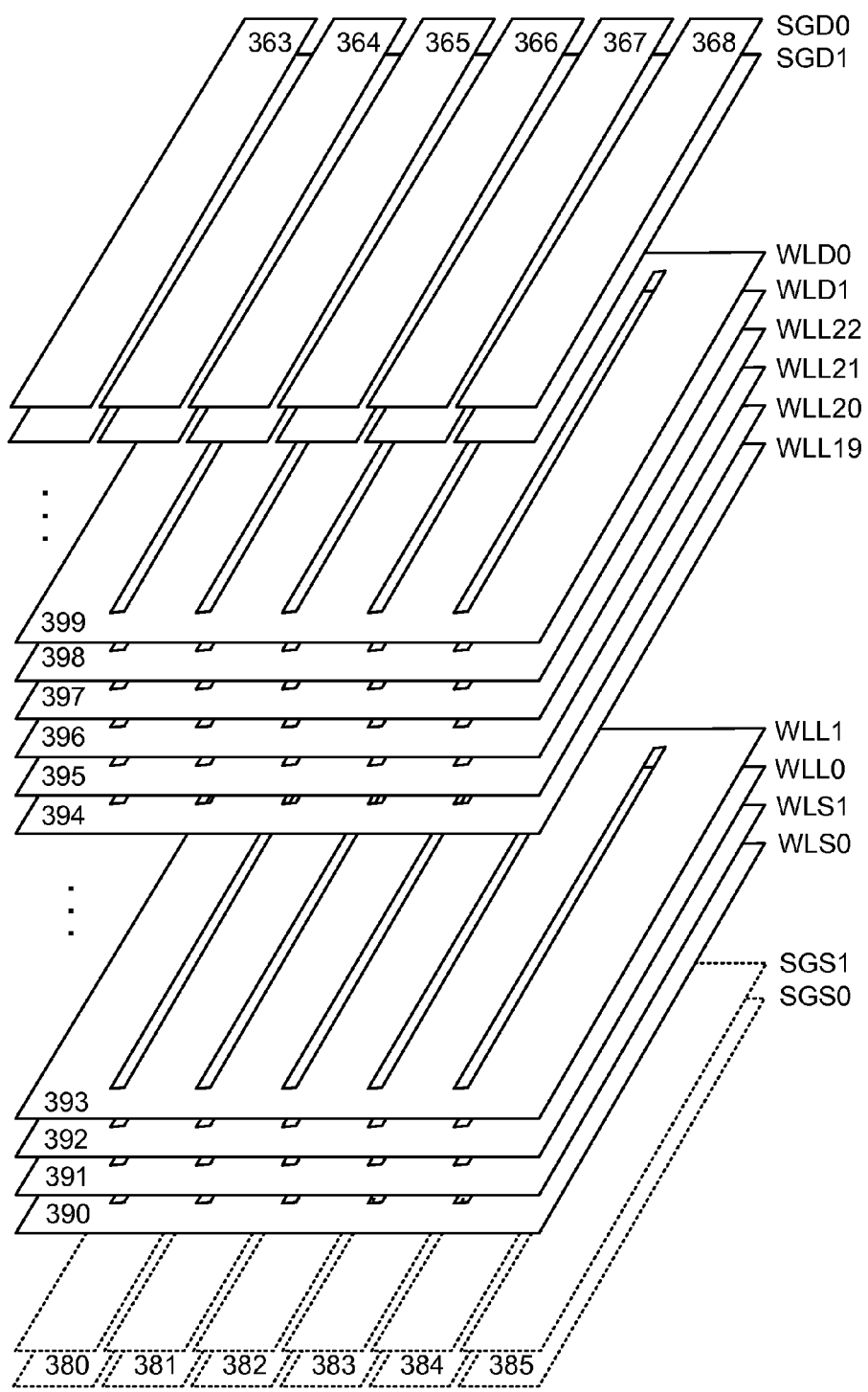

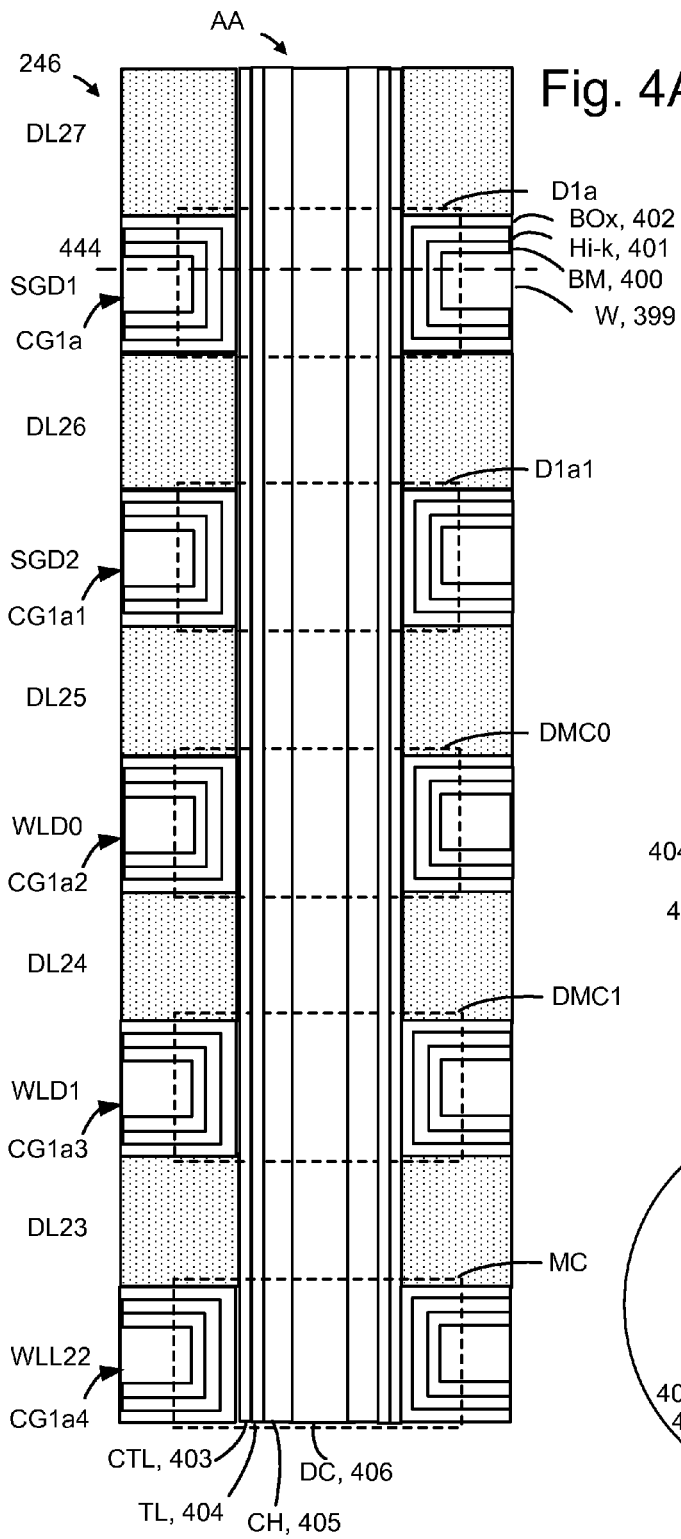
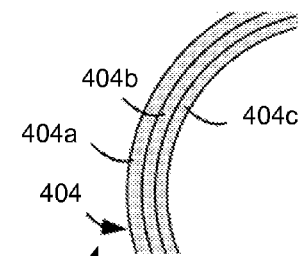
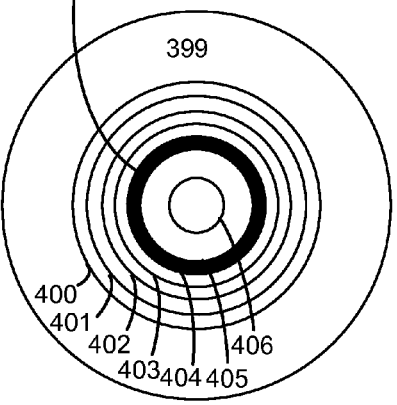

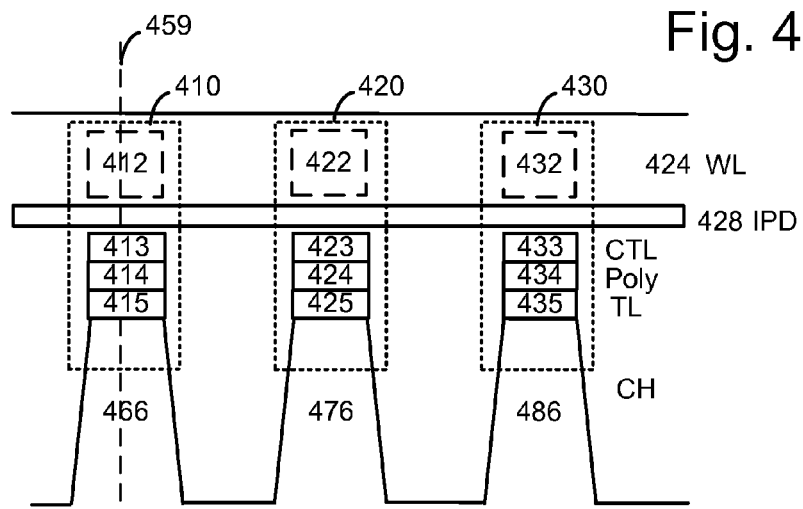
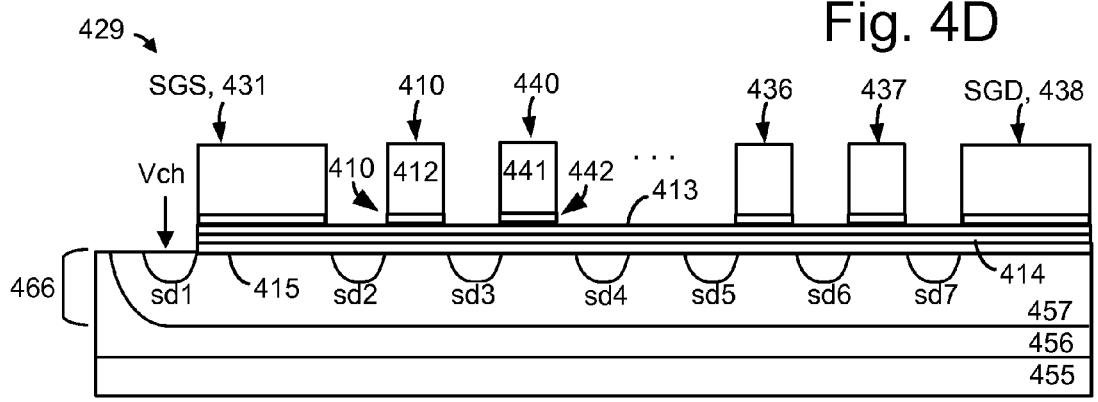

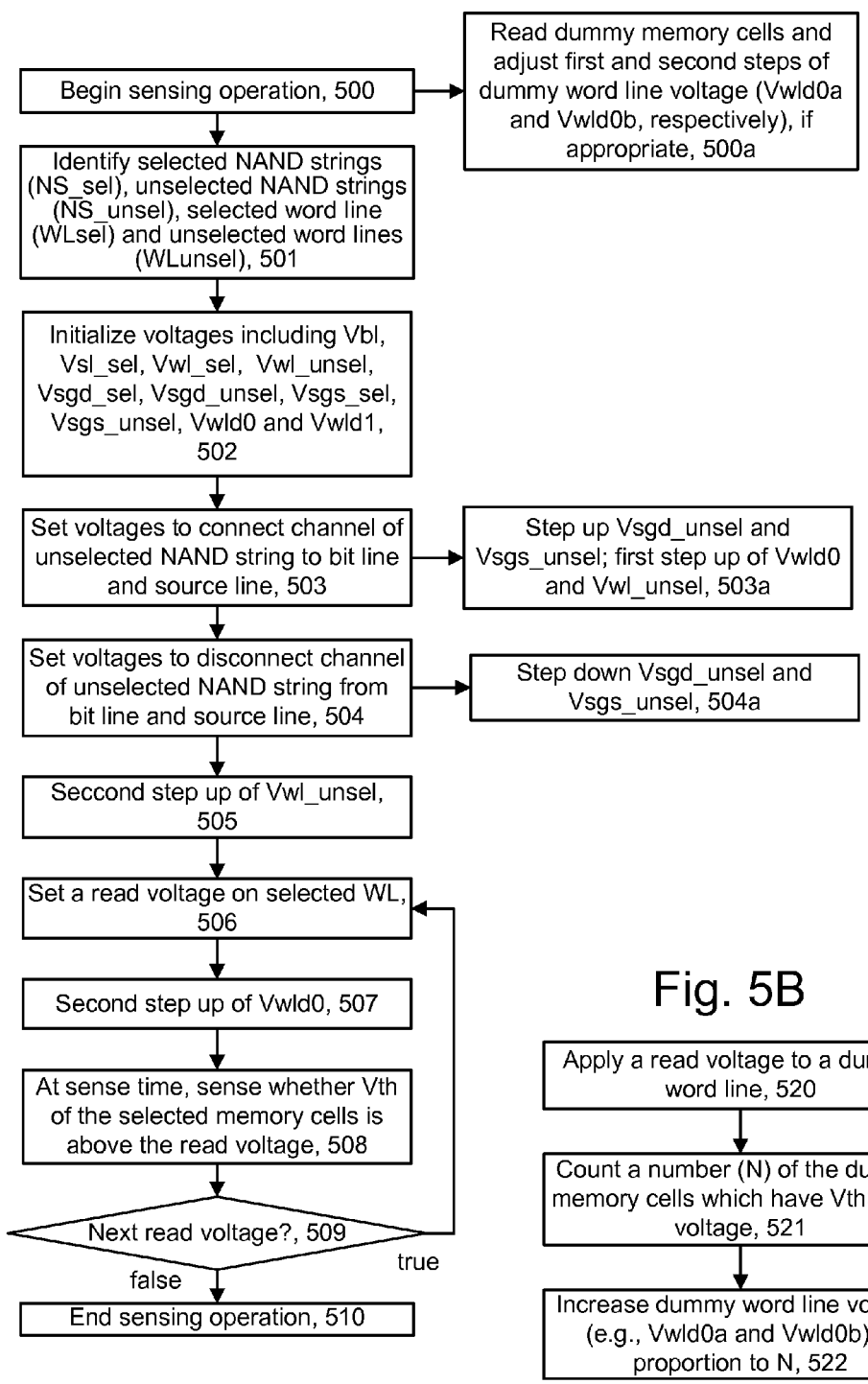

METHOD OF REDUCING HOT ELECTRON INJECTION TYPE OF READ DISTURB IN DUMMY MEMORY CELLS

CROSS-REFERENCE TO RELATED APPLICATIONS

This application claims the benefit of U.S. provisional patent application No. 62/107,911, filed Jan. 26, 2015, by H. Chen et al., titled "Method Of Reducing Hot Electron Injection Type Of Read Disturb In Data Memory Cells And Dummy Memory Cells In A Memory Device," incorporated herein by reference.

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C depicts code which may be executed by a processor.

FIG. 1D is a block diagram depicting one embodiment of the sense block SB1 of FIG. 1B.

FIG. 2A depicts a top view of example word line layers 202 and 204 in a U-shaped NAND embodiment, as an example implementation of BLK0 in FIG. 1A.

FIG. 2B depicts a top view of example select gate layer portions, consistent with FIG. 2A.

FIG. 2C depicts an embodiment of a stack 231 showing a cross-sectional view of the portion 209 of FIG. 2A, along line 220, where three select gate layers, SGL1, SGL2 and SGL3 are provided.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where two SGD layers, two SGS layers, and two dummy word line layers WLDa and WLDb are provided.

FIG. 3C2 depicts a variation in the width of a memory hole along its height.

FIG. 3D depicts an alternative view of the select gate layers and word line layers of the stack 376 of FIG. 3C.

FIG. 4A depicts a view of the region 246 of FIG. 3C1, showing SGD transistors D1a (consistent with FIG. 3C1) and D1a1 above dummy memory cells (DMC) DMC0 and DMC1 and a data-storing memory cell (MC).

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 4C depicts a cross-sectional view in a word line direction of memory cells comprising a flat control gate and charge-trapping regions a 2D example of memory cells in the memory structure 126 of FIG. 1B.

FIG. 4D depicts a cross sectional view along line 459 in FIG. 4C, showing a NAND string 429 having a flat control gate and a charge-trapping layer.

FIG. 5A depicts a process for performing a sensing operation on a selected word line, where a voltage on a dummy word line comprises two steps to reduce read disturb of dummy memory cells.

FIG. 5B depicts a process for reading dummy memory cells and adjusting a dummy word line voltage, consistent with step 500a of FIG. 5A.

DETAILED DESCRIPTION

Figure 1A:
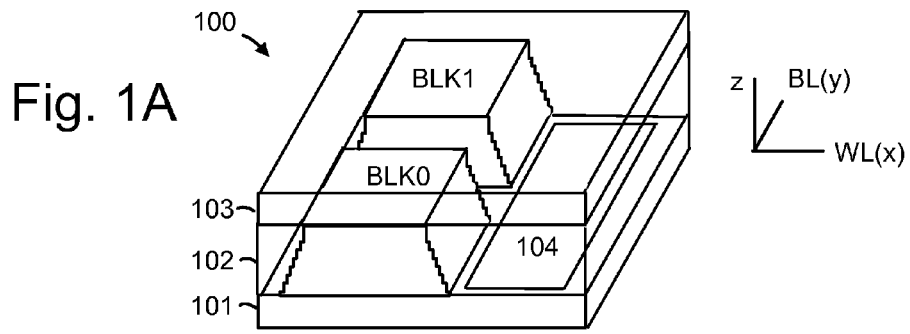
FIG. 1A is a perspective view of a 3D stacked non-volatile memory device.

Techniques are provided for performing a sensing operation in a memory device with reduced read disturb of dummy memory cells.

A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source-side transistors in NAND strings. Another example of a charge-trapping memory device is a 2D memory device in which the charge-trapping layer extends horizontally along a NAND string.

In such memory devices, a read operation which is performed to read the state of selected memory cells can adversely impact the state of unselected memory cells in a process referred to a read disturb. Read disturb can increases the threshold voltage (Vth) of unselected memory cells in a read operation. For example, the memory device can be arranged in multiple blocks, where each block includes multiple sub-blocks, and a read operation is performed on a selected sub-block. The different sub-blocks can have the same word line layer, bit line and source line biases, but typically have separate select gate (SG) biases for source-side select gate (SGS) transistors and drain-side select gate (SGD) transistors. During the read in the selected sub-block, the SGS and SGD transistors of the unselected sub-blocks are typically turned off (made non-conductive) to cut off the conduction paths in unselected strings of the memory cells. A read-pass voltage (Vpass) of about 7-9 V is applied to the unselected word line layers, boosting a peak channel voltage of the unselected strings to about 5-6 V. This full measure of boosting is due to capacitive coupling from the unselected word line layers to the channel.

This channel boosting can help reduce the occurrence of normal read disturb for the unselected cells of the unselected strings. Normal read disturb is caused by weak Fowler-Nordheim (F-N) tunneling due to a large voltage difference between the control gate and a channel of a cell.

Another type of read disturb is hot electron injection (HEI) type of read disturb. In this case, a channel gradient generates electron-hole pairs in which electrons can be inject into the charge trap layer of a memory cell, increasing its Vth. For example, when a memory cell is read with a relatively low voltage (Vwl_sel) on the selected word line layer, a large voltage gradient can be formed in the channel of the unselected NAND string which results in electron/hole generation. This gradient can be formed between the selected word line and either of the adjacent word lines (e.g., WLsel+1 on the drain-side of WLsel or WLsel−1 on the source-side of WLsel). The generated electrons can be injected into the charge trap layers of the memory cells connected to the adjacent word lines.

One way to suppress HEI read disturb is to discharge the boosting voltage in the channel in an unselected NAND string by grounding the channel, so that voltage gradient in the channel between the selected word line and the adjacent word lines is removed. This approach involves stepping up and then stepping down the voltage of the select gate transistor to electrically connect the channel with a driven bit line and/or source line which are grounded or at another low, driven voltage. However, the step down can result in a channel gradient between the select gate transistor and an adjacent dummy memory cell. A dummy memory cell does not store data and is ineligible to store data, and is used to provide a gradual transition in the channel voltage of a NAND string between one or more select gate transistors and the data memory cells, which are eligible to store data.

This channel gradient can cause HEI read disturb of the dummy memory cells. Although the dummy memory cells are not used to store data, the increase in their Vth due to read disturb can increase the amount of program disturb in a programming operation. This is due to a reduction in the boosting potential in the inhibited channel of the unselected NAND string.

A solution provided herein involves stepping up the voltage on a dummy word line in multiple steps such as two steps. This helps reduce the magnitude of an associated channel gradient when the voltage of the select gate transistor steps down. Moreover, after a first step up of the dummy word line and before a second step up of the dummy word line, a sufficient time is allowed for the associated channel gradient to reach a steady state after the voltage of the select gate transistor steps down. A magnitude of the second step up is sufficient to provide the dummy memory cells in a conductive state while minimizing an electric field between the control gates of the dummy memory cells and the channels of the unselected NAND strings, where this electric field could contribute to electron injection from the channel to the charge-trapping region of the dummy memory cells. As a result, a reduced electron injection occurs for the dummy memory cells compared to the case of a one-step increase of the dummy word line voltage to its final level.

A magnitude of the second step up is sufficient to provide the dummy memory cells in a strongly conductive state during sensing of selected data memory cells on a selected word line, to avoid a stray current in the unselected NAND strings which could impair the sensing in the selected NAND strings. Moreover, the increase of the second step is relatively small, e.g., 1-2 V, or smaller than the increase of the first step, to avoid creating an additional channel gradient which could cause additional HEI read disturb of the dummy memory cells.

Another aspect can involve stepping up the voltage on the unselected word lines in two steps, for instance. The second step up of the unselected word lines can be prior to the second step up of the dummy word line and can provide a small amount of channel boosting (e.g., 0.5-1.5 V) due to capacitive coupling. This amount of channel boosting is optimum for minimizing both HEI and normal read disturb of data memory cells and dummy memory cells.

These techniques can be implemented in a 2D or 3D memory device.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
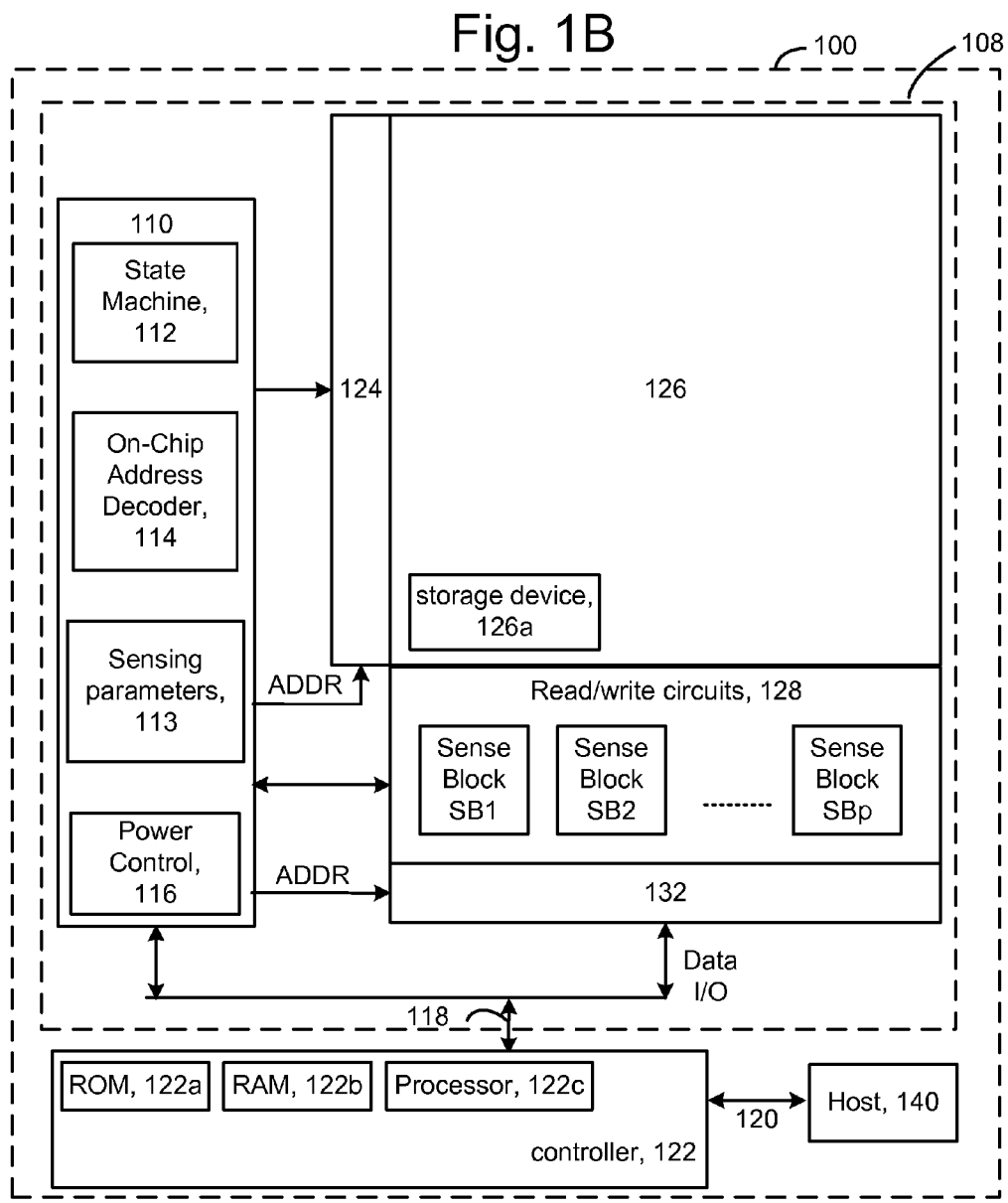
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for a sensing operation as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp (including the processor 192 and managing circuit MC0 in FIG. 1D), read/write circuits 128, and controller 122, and so forth. The sense block SB1 is discussed further in connection with FIG. 1D.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1C depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes: instructions to connect a channel of an unselected NAND string to a bit line while the bit line is at a driven voltage, the instructions to connect comprising instructions to step up a voltage on a select gate line, step up a voltage on a first dummy word line, and step up a voltage on unselected word lines (161). The bit line is connected to a selected NAND string, the select gate line is connected to a drain-side select gate transistor at a drain-side of the unselected NAND string and a drain-side select gate transistor at a drain-side of the selected NAND string, the first dummy word line is connected to a first dummy memory cell in the unselected NAND string adjacent to the drain-side select gate transistor of the unselected NAND string and to a first dummy memory cell in the selected NAND string adjacent to the drain-side select gate transistor of the selected NAND string, a selected word line is connected to a selected memory cell in the selected NAND string and to a corresponding unselected memory cell in the unselected NAND string. The control code further includes: instructions to, after the connecting, disconnect the channel of the unselected NAND string from the bit line, and the instructions to disconnect comprising instructions to step down the voltage on the select gate line (162). The control code further includes: instructions to, while the channel of the unselected NAND string is disconnected from the bit line, further step up the voltage of the first dummy word line, and subsequently sense the selected memory cell while one or more voltages are provided on the selected word line (163).

Generally, the control code can include instructions to perform the functions described herein including the steps of the processes of FIGS. 5A and 5B.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 1D is a block diagram depicting one embodiment of the sense block SB1 of FIG. 1B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL and UDL. LDL stores a bit for a lower page (LP) of write data, and UDL stores a bit for an upper page (UP) of write data, in a memory which stores two bits of data in each memory cell.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrEr/A, VrA/B and VrB/C in FIG. 6A) corresponding to the various memory states supported by the memory (e.g., states A, B and C), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers WLDa and WLDb, and select gate layers SGL1, SGL2 and SGL3. The word line layers are conductive paths to control gates of the memory cells at the layer. Moreover, each select gate layer may comprise conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain-side columns of respective NAND strings. Columns C1, C2, C5, C6, C9 and C10 represent the source-side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2D. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain-side of C0 and NS0 to a bit line 288. A via 262 connects a source-side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 2D:
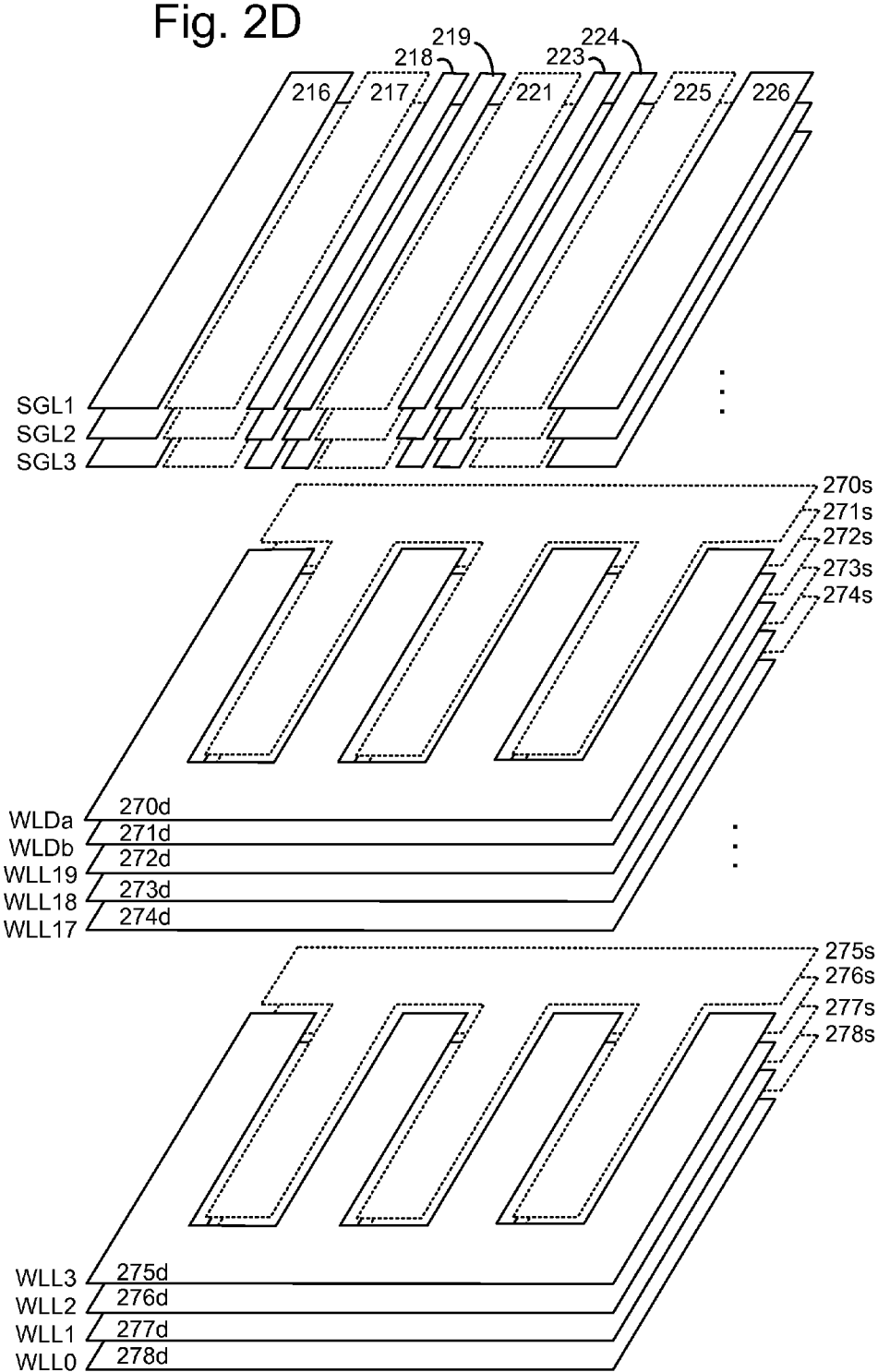
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach. The SGL layers are depicted at an elevated height in the figure so that the underlying layers can be seen more clearly.

Below, the SGL layers are the dummy word line layers (word line layers connected to dummy memory cells) and data word line layers (word line layers connected to data memory cells). Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, WLDa, WLDb, WLL19, WLL18 and WLL17 include drain-side word lines 270d, 271d, 272d, 273d and 274d, respectively, and source-side word lines 270s, 271s, 272s, 273s and 274s, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where two SGD layers, two SGS layers, and two dummy word line layers WLDa and WLDb are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL22, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A. Regions D1a and D1a1 represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, and a width of the vertically-extending memory holes varies along a height of the memory device.

FIG. 3D depicts an alternative view of the select gate layers and word line layers of the stack 376 of FIG. 3C. The SGD layers SGD0 and SGD1 each includes parallel rows of select gate lines associated with the drain-side of a set of NAND strings. For example, SGD0 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, WLD0, WLD1, WLL22, WLL21, WLL20 and WLL19 represent word lines 399, 398, 397, 396, 395 and 394, respectively. WLL1, WLL0, WLS1 and WLD0 represent word lines 393, 392, 391 and 390, respectively. Each word line can be controlled independently, in one approach. The SGD layers are depicted at an elevated height in the figure so that the underlying layers can be seen more clearly.

Below the word line layers are the SGS layers. The SGS layers SGS1 and SGS2 each includes parallel rows of select gate lines associated with the source-side of a set of NAND strings. For example, SGS0 includes source-side select gate lines 380, 381, 382, 383, 384 and 385. Each select gate line can be independently controlled, in one approach. The SGS layers are depicted at a reduced height in the figure so that they can be seen more clearly.

In an example programming operation, the source-side word line 392 is a first programmed word line and a drain-side word line 397 is a final programmed word line in a block.

FIG. 4A depicts a view of the region 246 of FIG. 3C1, showing SGD transistors D1a (consistent with FIG. 3C1) and D1a1 above dummy memory cells (DMC) DMC0 and DMC1 and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a and D1a1, the dummy memory cells DMC0 and DMC1, and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively low amount of channel boosting in a region of the channel next to these select gate transistors. A region of the channel next to an edge cell will therefore also have a relatively low amount of channel boosting. In contrast, the memory cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

FIG. 4C depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 426 extends across NAND strings which include respective channel regions 466, 476 and 486. Portions of the word line provide control gates 412, 422 and 432. Below the word line is an inter-poly dielectric (IPD) layer 428, charge-trapping layers 413, 423 and 433, polysilicon layers 414, 424 and 434 and tunneling layer (TL) layers 415, 425 and 435. Each charge-trapping layer extends continuously in a respective NAND string.

A memory cell 410 includes the control gate 412, the charge-trapping layer 413, the polysilicon layer 414 and a portion of the channel region 466. A memory cell 420 includes the control gate 422, the charge-trapping layer 423, the polysilicon layer 424 and a portion of the channel region 476. A memory cell 430 includes the control gate 432, the charge-trapping layer 433, the polysilicon layer 434 and a portion of the channel region 486.

Further, a flat control gate may be used instead of a control gate that wraps around a floating gate. One advantage is that the charge-trapping layer can be made thinner than a floating gate. Additionally, the memory cells can be placed closer together.

FIG. 4D depicts a cross sectional view along line 459 in FIG. 4C, showing a NAND string 429 having a flat control gate and a charge-trapping layer. The NAND string includes an SGS transistor 431, example memory cells 410, 440, . . . , 436 and 437, and an SGD transistor 438. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 410 includes the control gate 412 and an IPD layer 428 above the charge-trapping layer 413, the polysilicon layer 414, the tunneling layer 415 and the channel region 466. The memory cell 440 includes a control gate 441 and an IPD portion 442 above the charge-trapping layer 413, the polysilicon layer 414, the tunneling layer 415 and the channel region 466.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the memory cells but with a longer channel length to ensure that current is cutoff in an inhibited NAND string.

In this example, the layers 413, 414 and 415 extend continuously in the NAND string. In another approach, portions of the layers 413, 414 and 415 which are between the control gates 412, 422 and 432 can be removed, exposing a top surface of the channel region 466.

One or more dummy memory cells may be provided adjacent to the select gate transistors.

FIG. 5A depicts a process for performing a sensing operation on a selected word line, where a voltage on a dummy word line comprises two steps to reduce read disturb of dummy memory cells. The sensing operation begins at step 500. A sensing operation can include a read operation which determines the data state of a set of memory cells connected to a selected word line based on a read voltage which defines a lower Vth of the data state and a read voltage which defines an upper Vth of the data state, for example. See example read voltages of VrEr/A, VrA/B and VrB/C in FIG. 6A. This type of read operation occurs after a programming operation is completed. Another example of a sensing operation includes a verify test which determines whether the Vth of a memory cell exceeds the verify voltage of a respective target data state during a programming operation. See example verify voltages of VvA, VvB and VvC in FIG. 6A.

A further step 500a may be performed in connection with the sensing operation or at another time. Step 500a involves reading the dummy memory cells and adjusting first and second steps of a dummy word line voltage (e.g., Vwld0a and Vwld0b in FIG. 8C, respectively), if appropriate. See FIG. 5B for further details.

Step 501 includes identifying one or more selected NAND strings (e.g., NS_sel in FIG. 7), one or more unselected NAND strings (e.g., NS_unsel in FIG. 7), a selected word line (WLsel) and unselected word lines (WLunsel). For example, the selected NAND strings may be in a selected sub-block of memory cells (e.g., NS0A to NS0A-14 associated with region 340 in FIG. 3A), and the unselected NAND strings may be in one or more unselected sub-blocks of memory cells (e.g., NAND strings associated with regions 341-345 in FIG. 3A). Each sub-block of NAND strings may have a common control line connected to their SGD transistors, for instance.

Step 502 includes initializing the voltages including Vbl, Vsl_sel, Vwl_sel, Vwl_unsel, Vsgd_sel, Vsgd_unsel, Vsgs_sel, Vsgs_unsel, Vwld0 and Vwld1.

Figure 7:
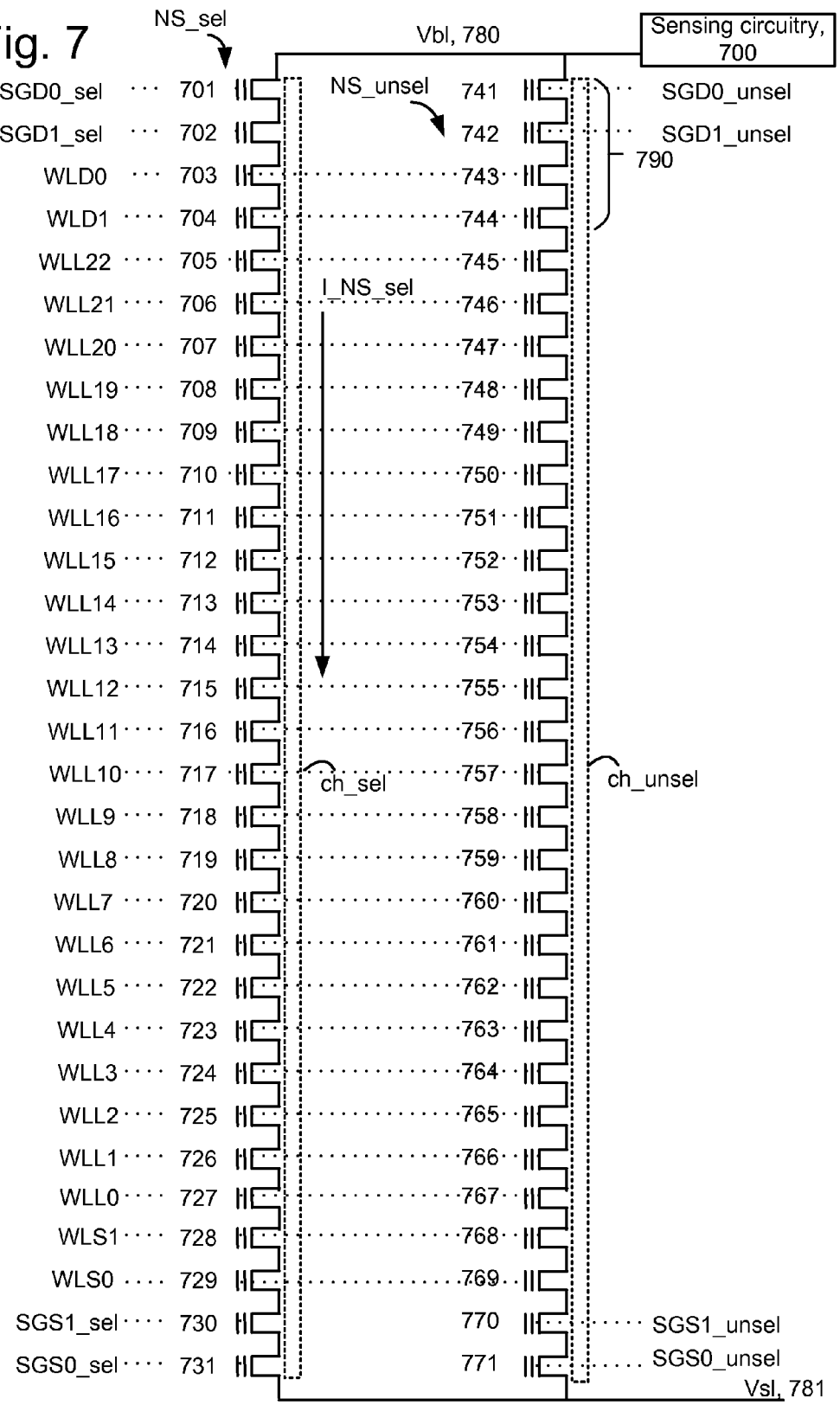
FIG. 7 depicts a circuit diagram of a selected NAND string (NS_sel) and an unselected NAND string (NS_unsel), consistent with the sensing process of FIG. 5A and with the memory devices of FIGS. 2C and 3C1.

Vwld and Vwld1 are voltages for dummy word lines WLD0 and WLD1, respectively, such as in FIG. 7. In practice, there may be one or more dummy memory cells at the drain-side of each NAND string and one or more associated dummy word lines. There may also be one or more dummy memory cells at the source-side of each NAND string and one or more associated dummy word lines, in which case Vwls0 and Vwls1 can also be initialized. Vwls0 and Vwls1 are voltages for dummy word lines WLS0 and WLS1, respectively, such as in FIG. 7. The initial voltages can be applied in the time period of t0-t1, for instance, in FIG. 8A-8F.

Step 503 sets voltages to connect a channel of each unselected NAND string to a respective bit line and source line. While the channel is connected, the bit line and source line can be driven at a voltage such as 0 V to discharge the channel. Optionally, the voltages are set to connect the channel to the bit line but not the source line. The channel is connected to the bit line, for instance, by stepping up the control gate voltages of the one or more drain-side select gate (SGD) transistors of each unselected NAND string to provide the SGD transistors in a conductive state and by stepping up the control gate voltages of the one or more drain-side dummy memory cells of each unselected NAND string to provide the dummy memory cells in a conductive state. A time interval in which the channel of an unselected NAND string is connected to the bit line is a time interval in which a control gate-to-drain voltage exceeds a threshold voltage for the drain-side SGD transistors, and a control gate-to-drain voltage exceeds a threshold voltage for the drain-side dummy memory cells.

If the channel was not connected to the bit line when the unselected word line voltages increase, the channel voltage would be capacitively coupled up by the increase in the unselected word line voltages to a relatively high level (e.g., as high as the voltage increase amount, particularly at the moment the unselected word line voltage is increased). A high channel boosting level helps reduce F-N read disturb because this type of read disturb is proportional to the control gate-to-channel voltage and increasing the channel voltage decreases the control gate-to-channel voltage. However, the high channel voltage increases HEI read disturb. This occurs because, when a memory cell is being read with a low read voltage (e.g., 0 V) applied on the selected word line (WLn), a large potential gradient is created in the channel between WLn and WLn+1 as well as between WLn and WLn−1. This potential gradient can result in electron/hole generation. The generated electrons can be injected into the charge trapping layer of the memory cells at WLn+1 and WLn−1, increasing the Vth of these memory cells.

One way to suppress the HEI type of read disturb is to discharge the boosting potential in the channel in the unselected NAND strings, so that potential gradient between WLn/WLn+1 and between WLn/WLn-1 is reduced. For example, one approach is to use a stepped waveform on the unselected word lines in combination with a spike of the select gate voltages which temporarily provides the select gate transistors in a conductive state and thereby allows the channel to be driven by a bit line and/or source line voltage. The stepped waveform on the unselected word lines may have two steps. The first step can occur when the select gate voltage increases to fully discharge the channels of the unselected NAND strings. After the select gate voltage has stepped down, the second step occurs to boost up the channel to a relatively small desired voltage (e.g., 0.5-1.5 V) by capacitive coupling.

Another issue is that the spiked voltage on the select gate line can cause HEI disturb of dummy memory cells. In particular, at the moment of the step down of the select gate voltage, a gradient in the channel potential is created between a select gate transistor and an adjacent dummy memory cell in an unselected NAND string. Moreover, when the Vth of the select gate transistor is programmed higher, the gradient is larger and, consequently, the HEI disturb is larger. Although dummy memory cells are not used to store data, the increase in the Vth of a dummy memory cell due to read disturb can impact the integrity of the program inhibit process by lowering the boosting potential in the inhibited channels during a programming operation, resulting in a larger program disturb.

A proposed solution is to ramp up the dummy word line voltage in two steps. In theory, two or more steps can be used. Moreover, the timing and magnitude of the two steps of the dummy word line voltage can be different relative to the two steps of the unselected word line voltage. The first step of the dummy word line voltage can be to a relatively small voltage such as 3 V (see also FIG. 8C) when the select gate line steps up, to help discharge the channel. This voltage provides the dummy memory cells in a conductive state, but with less of an overdrive than the second step. The second step of the dummy word line voltage can be to a somewhat higher voltage (e.g., 5 V) after the select gate line fully steps down to a steady state level (e.g., 0 V). This higher voltage provides a sufficiently strong overdrive of the dummy memory cells to prevent stray currents in the unselected NAND strings and thereby avoid impacting the sensing in the selected NAND strings. The time delay between the step down of the select gate line voltage and the second step of the dummy word line voltage should be large enough so that the gradient in the channel potential between a select gate transistor and an adjacent dummy memory cell has attenuated and come to a steady state level.

Accordingly, as depicted at step 503a, step 503 can involve stepping up Vsgd_unsel and Vsgs_unsel, and providing a first step up of Vwld0 and Vwl_unsel. For example, the first step up of Vsgd_unsel and Vsgs_unsel can occur at the time point t0 or t1 in FIG. 8B.

After the channel has been connected to the bit line, step 504 includes setting voltages to disconnect the channel of each unselected NAND string from the respective bit line and source line. As depicted at step 504a, step 504 can involve stepping down Vsgd_unsel and Vsgs_unsel. For example, the step down of Vsgd_unsel and Vsgs_unsel can occur at the time point t2 in FIG. 8B.

Figure 8A:
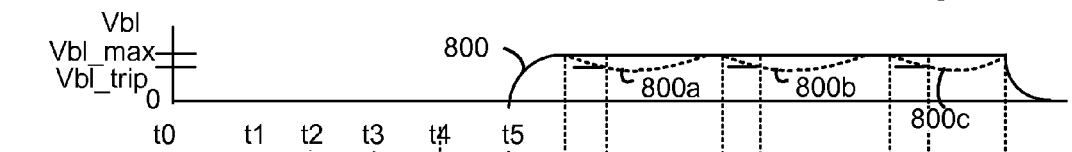
FIG. 8A depicts a plot 800 of bit line voltage versus time in a sensing operation consistent with FIG. 5A.
Figure 8B:
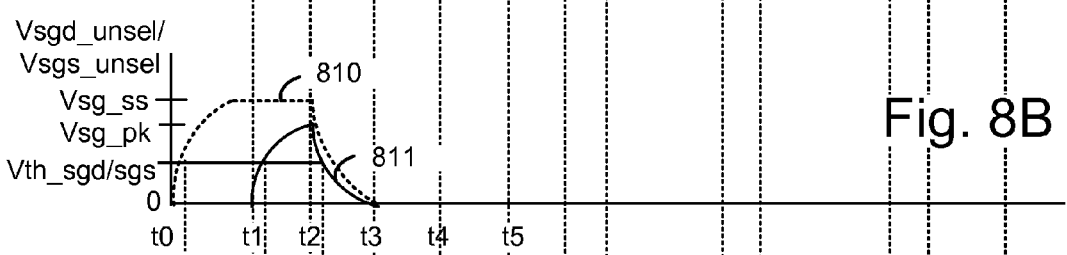
FIG. 8B depicts plots 810 and 811 of a select gate voltage versus time in a sensing operation consistent with FIG. 5A.
Figure 8C:
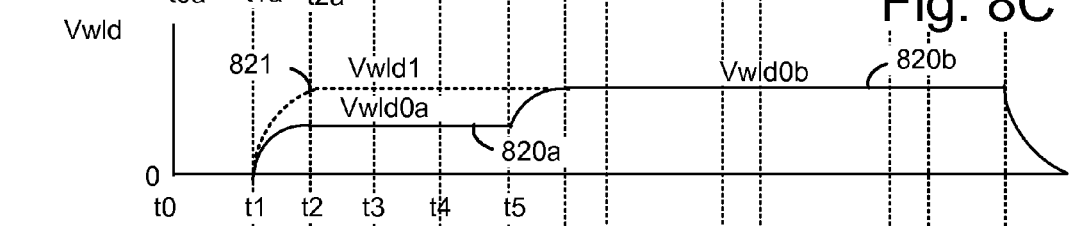
FIG. 8C depicts plots 820a, 820b and 821 of a dummy word line voltage versus time in a sensing operation consistent with FIG. 5A.
Figure 8D:
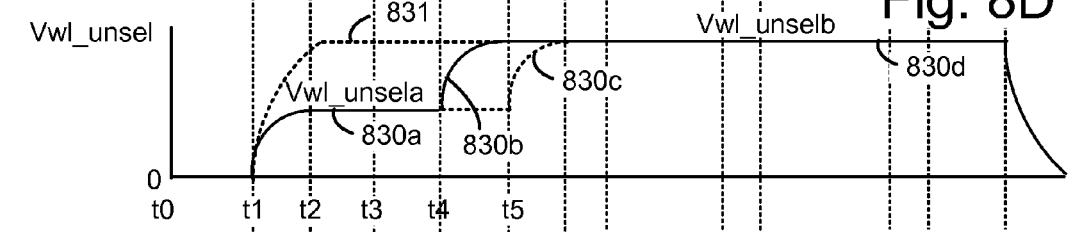
FIG. 8D depicts plots 830a, 830b, 830c, 830d and 831 of an unselected word line voltage versus time in a sensing operation consistent with FIG. 5A.

Step 505 provides a second step up of Vwl_unsel, such as at t4 or t5 in FIG. 8D.

Step 506 involves setting a read voltage on the selected word line (WL). For example, a first read voltage may be VrEr/A or VvA, such as in the time period t4-t7 in FIG. 8E.

Step 507 provides a second step up of the dummy word line voltage. In one approach, this occurs after a predetermined delay relative to the second step up of Vwl_unsel. For example, the second step up of the dummy word line voltage can be at a time point t5 in FIG. 8C while the second step up of Vwl_unsel is at t4. In another approach, the second step up of the dummy word line voltage can be concurrent with the second step up of Vwl_unsel. For example, the second step up of the dummy word line voltage and of Vwl_unsel can be at t4.

At a sense time, step 508 senses whether Vth of the selected memory cells is above the read voltage. The selected memory cells are the memory cells in the selected NAND strings which are connected to the selected word line. For example, in FIG. 8E, when the first read voltage is applied from t4-t7, the sense time may be t6a. When a second read voltage is applied from t7-t8, the sense time may be t7b. When a third read voltage is applied from t8-t9, the sense time may be t8b.

A decision step 509 determines if there is a next read voltage. If decision step 509 is true, the flow returns to step 506 when a next read voltage is set for the selected word line. If decision step 509 is false, the sensing operation ends at step 510, e.g., at time t9 in FIG. 8A-8F.

FIG. 5B depicts a process for reading dummy memory cells and adjusting a dummy word line voltage, consistent with step 500a of FIG. 5A. A process for reading the dummy memory cells and adjusting first and second steps of a dummy word line voltage can be performed at various times. For example, the process may be performed after a specified number of read cycles, e.g., read operations, have been performed. The number of read cycles may be indicated by a number of program-erase cycles. In another approach, the process may be performed when a number of read errors as detected by an error-correction code (ECC) has increased above a threshold level. In another approach, the process may be performed after passage of a specified amount of time. In another approach, the process may be performed based on a temperature history of the memory device, so that the process is performed relatively more frequently when the temperature has been relatively higher. Other approaches are possible as well. A goal is to perform the process when it is believed that the Vth of the dummy memory cells has increased noticeably. This increase can occur even if the techniques for reducing read disturb as described herein are used.

Figure 6A:
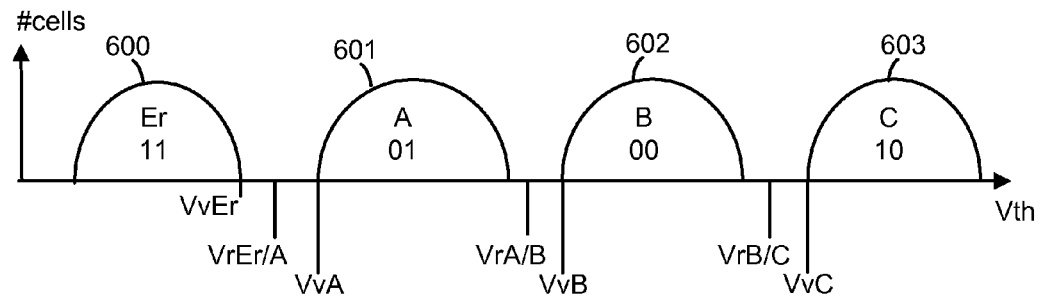
FIG. 6A depicts a threshold voltage (Vth) distribution and example read voltages for a set of memory cells, consistent with the process of FIG. 5A.
Figure 6B:
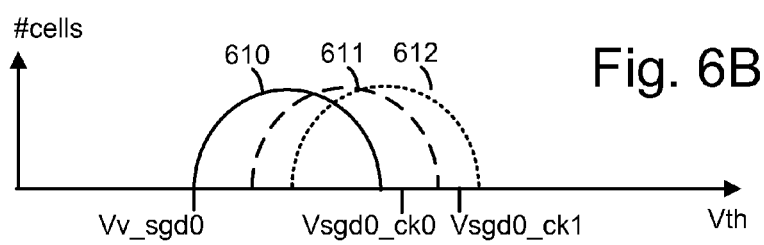
FIG. 6B depicts a Vth distribution and example read voltages for a set of dummy memory cells, consistent with step 500a of FIG. 5A and with FIG. 5B.

FIG. 6B provides additional information regarding the process. FIG. 6B depicts a Vth distribution and example read voltages for a set of dummy memory cells, consistent with step 500a of FIG. 5A and with FIG. 5B. Generally, a dummy memory cell can be programmed at the time of manufacture to have a specified Vth. In some cases, multiple dummy memory cells in a NAND string will have a same Vth. In other cases, the Vth can be different for different dummy memory cells in a NAND string. For example, the Vth for drain-side dummy memory cells can be higher for a dummy memory cell which is closer to the drain-side of the NAND string than for a dummy memory cell which is further from the drain-side of the NAND string. For instance, the dummy memory cells 703 and 743 in FIG. 7 can have a higher Vth than the dummy memory cells 704 and 744. As an example, the higher Vth is 3-4 V and the lower Vth is 2 V. The Vth of the multiple SGD transistors in the same NAND string can be the same, e.g., 5 V.

The Vth distribution 610 represents a set of dummy memory cells connected to the select gate line SGD0 in a fresh memory device (with zero or few read cycles). These dummy memory cells are programmed using a verify voltage of Vv_sgd0. Step 520 of the process of FIG. 5B involves applying a read voltage to the dummy word line. For example, Vsgd0_ck0 (a check point voltage) can be applied. If the Vth distribution 610 has shifted up over time due to read disturb to obtain the Vth distribution 611, a portion of the dummy memory cells will have a Vth>read voltage (Vth>Vsgd0_ck0). A count of a number N of these dummy memory cells can be obtained and used as a metric of the amount of Vth increase (step 521). Step 522 involves increasing the dummy word line voltages (e.g., Vwld0a and Vwld0b) in proportion to N. For example, the first and second step voltages can be increased by the same amount so that the difference between them remains constant.

When the adjustment process of FIG. 5B is performed a subsequent time, it is possible to use a higher read level, e.g., Vsgd0_ck1. In this case, the Vth distribution 611 has shifted up over time due to obtain the read disturb to the Vth distribution 612.

FIG. 6A depicts a threshold voltage (Vth) distribution and example read voltages for a set of memory cells, consistent with the process of FIG. 5A. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in FIG. 1D. For example, the LP bit can be stored in LDL and the UP bit can be stored in UDL. In another example, each memory cell stores three bits of data in one of eight possible Vth ranges.

A first Vth distribution 600 is provided for erased (Er) state memory cells. Vth distributions 601, 602 and 603 represent target data states A, B and C, respectively, which are reached by memory cells when their Vth exceeds the verify voltage VvA, VvB or VvC, respectively. VvEr is an erase verify voltage.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

Figure 6C:
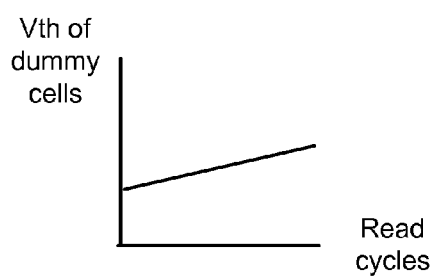
FIG. 6C depicts an increase in the Vth of a set of dummy memory cells as a function of read cycles for data memory cells.

FIG. 6C depicts an increase in the Vth of a set of dummy memory cells as a function of read cycles for data memory cells. A number of factors can cause read disturb of dummy memory cells. One factor is read cycles. During each read cycle, as mentioned at the outset, a channel gradient can be created between a select gate transistor and an adjacent dummy memory cell. This channel gradient can cause HEI read disturb of the dummy memory cell. Moreover, as read cycles accumulate, the HEI accumulates and gradually increases the Vth of the dummy memory cell. The techniques provided herein can reduce the rate of increase in Vth as a function of read cycles.

Figure 6D:
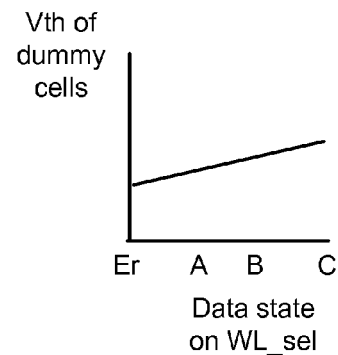
FIG. 6D depicts an increase in the Vth of a set of dummy memory cells after a number of read cycles for data memory cells, as a function of the data state of the data memory cells.

FIG. 6D depicts an increase in the Vth of a set of dummy memory cells after a number of read cycles for data memory cells, as a function of the data state of the data memory cells. Testing further indicates that read disturb of dummy memory cells in unselected NAND strings is more severe when the data memory cells in the unselected NAND strings have been programmed to a higher data state. This is because programming to a higher data state involves more programming loops in each programming operation, where each programming loop involves multiple read cycles due to the verify operations. This plot confirms the model of read cycles causing read disturb of the dummy memory cells.

FIG. 10A to 10F, discussed further below, depict other factors which can affect read disturb of dummy memory cells.

Figure 6E:
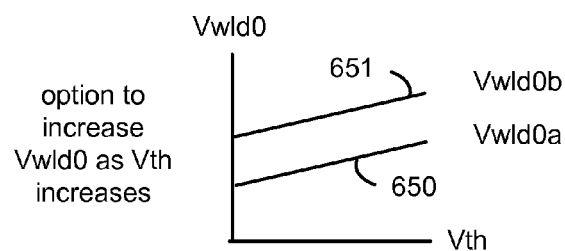
FIG. 6E depicts a plot of an increase in first and second steps of a dummy word line voltage during sensing of data memory cells and as a function of an increase in the Vth of associated dummy memory cells, consistent with step 522 of FIG. 5B and with FIG. 8C.

FIG. 6E depicts a plot of an increase in first and second steps of a dummy word line voltage during sensing of data memory cells and as a function of an increase in the Vth of associated dummy memory cells, consistent with step 522 of FIG. 5B and with FIG. 8C. To compensate for the increase in the Vth, the first step up voltage (Vwld0a) and the second step up voltage (Vwld0b) of a dummy word line voltage can be increased in proportion to the increase in the Vth. For example, each time the process of FIG. 5B is used to determine an increase in the Vth, as represented by the count N and the read voltage, the dummy word line voltages can be increased. A plot 650 represents Vwld0a and a plot 651 represents Vwld0b. In one approach, Vwld0a and Vwld0b can be increased by equal amounts so that the difference between them remains constant. A controller such as a state machine can be configured with instructions to perform this process. Therefore, a level of the first step up of the voltage on the first dummy word line and a level of the second step up of the voltage on the first dummy word line can increase periodically over a lifetime of the memory device.

FIG. 7 depicts a circuit diagram of a selected NAND string (NS_sel) and an unselected NAND string (NS_unsel), consistent with the sensing process of FIG. 5A and with the memory devices of FIGS. 2C and 3C1. The word lines for data-storing memory cells are WLL0-WLL22. WLL0-WLL22 are connected to data-storing memory cells 727-705, respectively, in NS_sel and to data-storing memory cells 767-745, respectively, in NS_unsel. Dummy word lines WLD1 and WLD0 are connected to dummy memory cells 704 and 703, respectively, in NS_sel and to dummy memory cells 744 and 743, respectively, in NS_unsel. The word lines are connected to both the selected and unselected NAND strings. WLD0 can be considered a first dummy word line and WLD1 can be considered a second dummy word line.

Moreover, as an example, WLL21 is a selected word line and WLL0-WLL20 and WLL22 are unselected word lines. In this case, the memory cell 706 is a selected memory cell in NS_sel, the memory cell 746 is a corresponding unselected memory cell in NS_unsel, the memory cells 705 and 707-727 are unselected memory cells in NS_sel and the memory cells 745 and 747-767 are unselected memory cells in NS_unsel.

SGD lines, SGD0_sel and SGD1_sel are connected to the SGD transistors 701 and 702, respectively, in the selected NAND strings and, optionally, to one another. SGS lines SGS0_sel and SGS1_sel are connected to the SGS transistors 731 and 730, respectively, in the selected NAND strings and, optionally, to one another.

SGD lines SGD0_unsel and SGD1_unsel are connected to the SGD transistors 741 and 742, respectively, in the unselected NAND strings and, optionally, to one another. SGS lines SGS0_unsel and SGS1_unsel are connected to the SGS transistors 771 and 770 respectively, in the unselected NAND strings and, optionally, to one another. As mentioned, each NAND string can have one or more SGD transistors and one or more dummy memory cells at the drain-side and source-side of a NAND string. The dummy memory cell which is most likely to have read disturb is next to a select gate transistor. Moreover, read disturb is more likely to occur at the drain-end than the source-end.

I_NS_sel is a current in NS_sel. The current is sensed by sensing circuitry 700 via a bit line 780 which is at a voltage, Vbl. A channel of NS_sel is ch_sel and has a voltage of Vch_sel. A channel of NS_unsel is ch_unsel and has a voltage of Vch_unsel. A portion 790 of ch_unsel is discussed further in connection with FIG. 9A to 9C.

A common bit line 780 connects the drain end of the NAND strings to the sensing circuitry, which is used to sense NS_sel during a sensing operation. A source line 781 is connected to source ends of the NAND strings. Voltage drivers can be used to provide voltages on the control lines (e.g., word lines, select gate lines, bit line and source line). See also FIG. 12A.

The horizontal axes of FIG. 8A to 8F are time-aligned with one another. The time points and voltages are not necessarily to scale.

FIG. 8A depicts a plot 800 of bit line voltage versus time in a sensing operation consistent with FIG. 5A. From t045, Vbl may be driven at 0 V or other relatively low voltage. This is the voltage that will be coupled to the channel of the unselected NAND string when the SGD transistors are provided in a conductive state, as depicted by FIG. 8B. From t5-t9, Vbl is stepped up to Vbl_max, e.g., 2-3 V which is appropriate for maintaining the SGD transistors in a non-conductive state so that stray currents are avoided in the unselected NAND strings. Further, during sensing, from t6-t6a, t7a-t7b and t8a-t8b, Vbl may remain relatively steady or may decay during sensing of a selected NAND string. Recall that each bit line may be connected to a selected NAND string and one or more unselected NAND strings. The decay is depicted by plots 800a, 800b and 800c. If Vbl decays below a specified trip level, Vbl trip, the selected NAND string is considered to be in a conductive state and the Vth of the selected memory cell is below the voltage on the selected word line. If Vbl does not decay below Vbl trip, the selected NAND string is considered to be in a non-conductive state and the Vth of the selected memory cell is equal to or above the voltage on the selected word line.

The SGS transistors may controlled using a waveform similar to plot 800.

FIG. 8B depicts plots 810 and 811 of a select gate voltage versus time in a sensing operation consistent with FIG. 5A. The plot 810 shows an option in which a request to step up the select gate voltage occurs at t0. In response, an associated voltage driver begins to increase its output voltage. At t0a, the voltage output increase above Vth_sgd/sgs, the Vth of the select gate transistor. As a result, the select gate transistor becomes conductive so that the bit line voltage is passed to the channel. In the case of the SGD transistor, this assumes Vbl=0 V, which is the voltage of the drain of the select gate transistor. The channel is therefore grounded. See FIG. 8F, where Vch_unsel=0 V from t044. Generally, the SGD transistor will be conductive if the control gate-to-drain voltage exceeds the Vth. Further, with plot 810, at t1, the voltage output reaches the requested level, which is the steady state level Vsg_ss. The voltage output remains at Vsg_ss from t1-t2. At t2, the voltage driver is requested to provide an output voltage of 0 V, and the voltage output decays from t2-t3. At t2a, the voltage output falls below Vth_sgd/sgs so that the select gate transistor returns to the non-conductive state. The voltage of the channel may float at this time. With plot 810, the select gate transistors are conductive during a first step increase in Vwl_unsel (FIG. 8D) from t1-t2.

The step up levels of the voltages can differ for the source-side versus drain-side select gate transistors.

In contrast, with plot 811, the select gate transistors are non-conductive during a portion of the first step increase in Vwld (FIG. 8C) and Vwl_unsel (FIG. 8D) from t1-t2. Specifically, a request to step up the select gate voltage occurs at t1. At t1a, the voltage output increase above Vth_sgd/sgs, so that the select gate transistor becomes conductive and the bit line voltage is passed to the channel. At t2, the voltage driver is requested to provide an output voltage of 0 V, and the voltage output decays from t2-t3. At t2a, the voltage output falls below Vth_sgd/sgs so that the select gate transistor returns to the non-conductive state. In this case, the time interval t1-t2 is not long enough for the voltage output to reach the steady state voltage and the voltage output has a spike shape. From t1-t1a, the channel voltage is floated because the select gate transistors are a non-conductive. The increase in Vwl_unsel in this time interval can increase Vch_unsel due to capacitive coupling from the unselected word lines to the channel. See plot 851 in FIG. 8F. Vch_unsel may decrease when the select gate transistor becomes conductive, and when Vbl=0 V or other low value, but some of the increase in Vch_unsel may be retained at t2a, when the select gate become non-conductive again. As a result, a higher level of Vch_unsel can be achieved by controlling the select gate transistor so that it is non-conductive during a portion of the time Vwl_unsel is increasing as with plot 811, compared to controlling the select gate transistor so that it is non-conductive throughout the time Vwl_unsel is increasing, as with plot 810. This higher level of Vch_unsel may be optimum to reduce both HEI and F-N read disturb.

In FIG. 8B, the select gate voltage may remain at 0 V or other low level from t3-t9 when the sensing in the selected NAND string occurs. This ensures that the SGD transistors of the unselected NAND string have a high drain-to-control gate voltage and are therefore strongly non-conductive. The SGD transistors of the selected NAND string are conductive during the sensing.

FIG. 8B depicts one increase followed by one decrease of a voltage on the select gate line, while FIG. 8 C depicts one increase followed by another increase of a voltage on a first dummy word line, and FIG. 8D depicts one increase of voltages of the unselected word lines while the bit line is at one driven voltage followed by another increase of voltages of the unselected word lines while the bit line is at another driven voltage.

FIG. 8C depicts plots 820a, 820b and 821 of a dummy word line voltage versus time in a sensing operation consistent with FIG. 5A. Plot 820a represents the first step up of the voltage (Vwld0) of the dummy word line (WLD0) which is adjacent to a select gate line (SGD1). Plot 820b represents the second step up of Vwld0. As mentioned, read disturb is most problematic for the associated dummy memory cells of WLD0, compared to the associated dummy memory cells of other dummy word lines such as WLD1. For comparison, plot 821 represents a single step up of the voltage (Vwld1) of another dummy word line which is adjacent to WLD0. Alternatively, two steps could be used for WLD1 as well.

The first step up of Vwld0 is to Vwld0a, e.g., 3 V, and the second step up of Vwld0 is to Vwld0b, e.g., 5 V. The level of the first step is sufficiently high to provide the associated dummy memory cells in a conductive state. However, by not stepping up Vwld0 directly to its peak level (Vwld0b), the HEI read disturb is minimized because the channel gradient between WLD0 and SGD1 is minimized. See also FIG. 9A to 9C. Additionally, a predetermined delay can be imposed between the time the select gate transistor becomes non-conductive (t2a) and the time of the second step up (t5) to allow the channel gradient to attenuate to a steady state condition. See FIGS. 9B and 9C. Moreover, the size of the second step can be relatively small, e.g., 2 V, for the same reason that the first step is relatively small—to minimize the channel gradient between WLD0 and SGD1. The final voltage of the dummy word line, Vwld0b, is optimized to provide the dummy memory cells in a strongly conductive state to avoid stray currents in the unselected NAND strings.

FIG. 8D depicts plots 830a, 830b, 830c, 830d and 831 of an unselected word line voltage versus time in a sensing operation consistent with FIG. 5A. When the unselected word line voltage is increased, the channel voltage can be capacitively coupled higher if the unselected word line voltage is floating, e.g., if the select gate transistors are non-conductive. The channel of the unselected word line (Vch_unsel) will be boosted according to Vch_unsel=CRx(Vwl_unselb–Vwl_unsela), where CR is a coupling ratio such as about 0.5-0.8. If this coupling is too high, a larger channel gradient can be created which causes read disturb of the data memory cells. See FIGS. 11A and 11B. Accordingly, Vwl_unsel can be stepped up in a first step to Vwl_unsela (e.g., 6 V) at t1 and to a second step of Vwl_unselb (e.g., 8 V) at t4 or t5. Typically, Vwl_unsela>Vwld0a and Vwl_unselb>Vwld0b. Further, in one approach, Vwl_unselb–Vwl_unsela=Vwld0b–Vwld0a.

The second step up occurs while the channel voltage is floating so that the channel voltage can be capacitively coupled up to a level which is optimal to combat F-N read disturb. The coupled up reduced the control gate-to-channel voltage which causes this type of read disturb. The channel gradient between SGD1 and WLD0 is not directly affected by the stepping up of Vwl_unsel.

As mentioned, in one approach, the dummy word line voltage steps up after the unselected word line voltage, to allow extra time for the channel gradient between SGD1 and WLD0 to attenuate and stabilize. This extra time (t4-t5) does not result in a serious delay in sensing. This separate step up approach is represented by the plot 830a, 830b and 830d for Vwl_unsel. One advantage of this approach is that WL_unsel is raised quickly after the select gate transistors become non-conductive and can stabilize before sensing occurs. For instance, a common high capacity voltage driver may be used to drive the unselected word lines, where such a voltage driver requires a longer time to reach steady state compared to the case of a separate voltage driver for each word line. Another advantage is that the separate step up of Vwl_unsel and Vwld may tend to increase the electrical field between WL_unsel and the channel to a lesser degree compared to the concurrent step up of Vwl_unsel and Vwld. As a result, an increase in the F-N read disturb may be avoided compared to the concurrent step up.

In another approach, Vwl_unsel and Vwld step up together in the second step. This approach is represented by the plots 830a, 830c and 830d for Vwl_unsel. One advantage of this approach is that it eliminates a possible ~2 V difference in channel potential between a dummy memory cell and a data memory cell. However, this usually does not do as much harm as the larger channel potential difference between a select gate transistor and a dummy memory cell.

A particular memory device can be evaluated to determine whether the separate step up is preferable to the concurrent step up.

Another dummy word line which is not adjacent to a select gate word line can be stepped up in one step as depicted by plot 821. Alternatively, two steps may be used. Further, the amplitude of the steps can be different for different memory cells in a NAND string according to their respective Vth, where the steps are proportional to the Vth to provide a sufficient overdrive of the dummy memory cells to provide them in a conductive state.

Figure 8E:
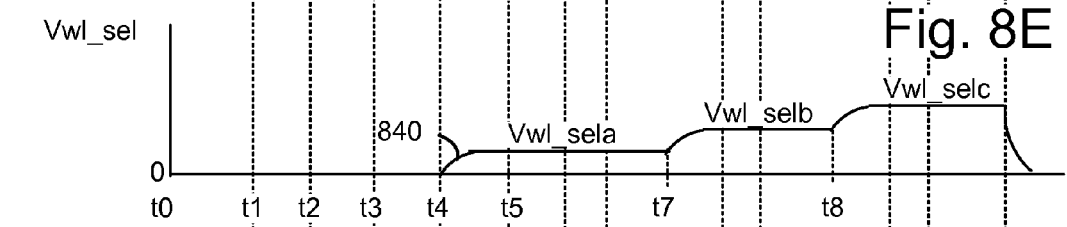
FIG. 8E depicts a plot 840 of a selected word line voltage versus time in a sensing operation consistent with FIG. 5A.

FIG. 8E depicts a plot 840 of a selected word line voltage versus time in a sensing operation consistent with FIG. 5A. In one approach, Vwl_sel remains at 0 V from t0-t4 so that the channel portions in the unselected NAND string on either side of the selected word line are cutoff from one another. Alternatively, Vwl_sel may be temporarily stepped up so that the associated memory cells are in a conductive state when the SGD transistors are in a conductive state. At t4, Vwl_sel is set to a first read voltage, Vwl_sela, e.g., VrEr/A or VvA. At t6, the sensing circuitry is activated to sense a voltage of the bit line. If a current flows through the selected NAND string connected to the bit line, Vbl decreases, as mentioned in connection with FIG. 8A. The time interval t6-t6a is used for this sensing operation. At t7, Vwl_sel is set to a second read voltage, Vwl_selb, e.g., VrA/B or VvB. The time interval t7a-t7b is used for this sensing operation. At t8, Vwl_sel is set to a third read voltage, Vwl_selc, e.g., VrB/C or VvC. The time interval 87a-t8b is used for this sensing operation. Generally, sensing at one or more read levels can be done.

Figure 8F:
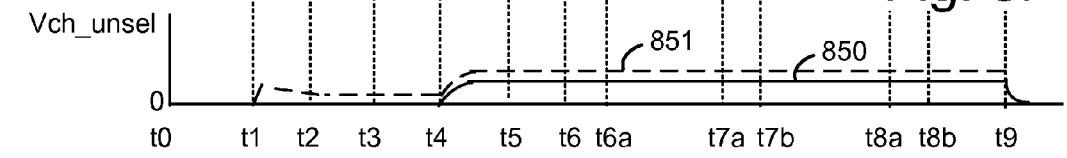
FIG. 8F depicts a plot 850 of a channel voltage of an unselected NAND string versus time in a sensing operation consistent with FIGS. 5A and 8A to 8E.

FIG. 8F depicts a plot 850 of a channel voltage (Vch_unsel) of an unselected NAND string versus time in a sensing operation consistent with FIGS. 5A and 8A to 8E. This plot is achieved by controlling the select gate transistors using the plot 810 of FIG. 8B. In this case, the SGD transistors are conductive throughout the time interval t1-t2 in which Vwld and Vwl_sel are increasing. In another approach, the plot 851 is achieved by controlling the select gate transistors using the plot 811 of FIG. 8B. In this case, the SGD transistors are non-conductive in a portion of the time interval t1-t2 in which Vwld and Vwl_sel are increasing, so that the channel is floating and capacitively coupled higher. The channel voltage depicted is an average across a NAND string as there can be localized areas of higher or lower voltage.

Thus, for data word lines, it is useful to fully discharge the channel in the unselected NAND strings to minimize HEI read disturb on WLn+1/WLn-1. This can be achieved by stepping up the select gate line to make the select gate transistor conductive and stepping up the unselected word line voltage and the dummy word line voltage so that the channel is conducting and hence discharged to the driven bit line and/or source line. Additionally, a small boosting potential can be created in the channels of the unselected NAND strings to minimize the electric field between the channel and the control gates of the data memory cells so that F-N read disturb is suppressed. To achieve this, after the select gate line voltage steps down, resulting in the SGD and SGS transistors being non-conductive, the unselected word line voltage is stepped up again to slightly boost up the discharged channel to the desired boosting potential.

For dummy word lines, HEI program disturb on WLD0 (the dummy word line adjacent to a select gate line) is suppressed by providing a first step up of the dummy word line voltage to a relatively low level. Subsequently, the channel potential gradient created between the SGD transistor and the dummy memory cell of WLD0 immediately after the select gate line voltage steps down will become smaller over a predetermined time delay. After the time delay, a second step up of the dummy word line voltage occurs to provide the dummy word line voltage at a desired level which is sufficient to make the dummy memory cells in the unselected NAND strings fully conductive during sensing operations in the selected NAND strings. Thus, to smooth out the channel potential, it is helpful to ramp up WLD0 in two steps (e.g., 0 V to 3 V to 5 V) while other dummy word lines such as WLD1 which are not adjacent to a select gate line can be ramped up in one step or two steps. Moreover, WLD1 can differ from WLD0 when the Vth of the dummy memory cells on WLD1 are different than on WLD0.

Figure 9A:
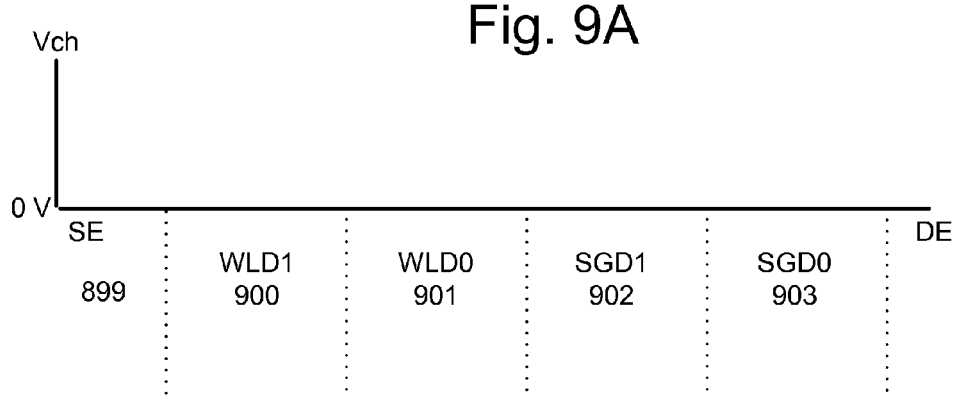
FIG. 9A depicts a plot of a channel voltage (Vch_unsel) of an unselected NAND string versus channel position, while a select gate is in a conductive state, consistent with the time interval t0a-t2a (plot 810) or t1a-t2a (plot 811) in FIG. 8B.
Figure 9B:
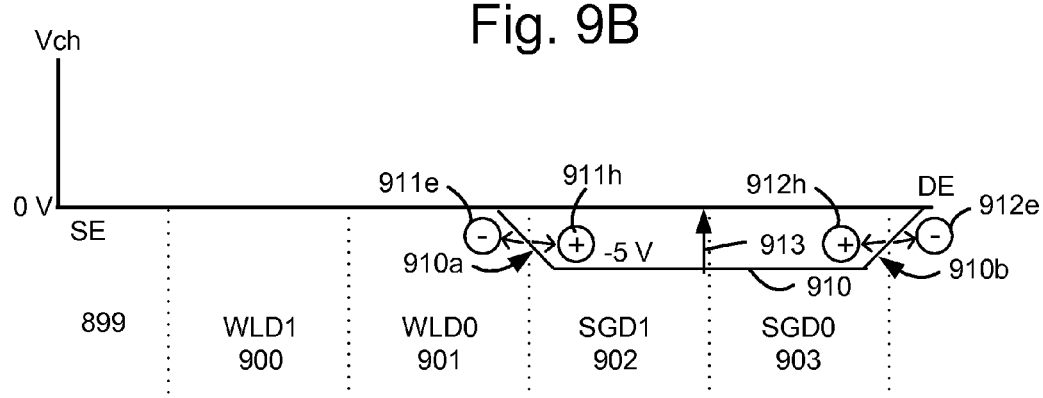
FIG. 9B depicts a plot of a channel voltage (Vch_unsel) of an unselected NAND string versus channel position, when a voltage of a select gate is stepped down while the dummy word lines and unselected word line are in a steady state, consistent with the time point t2a in FIG. 8B.
Figure 9C:
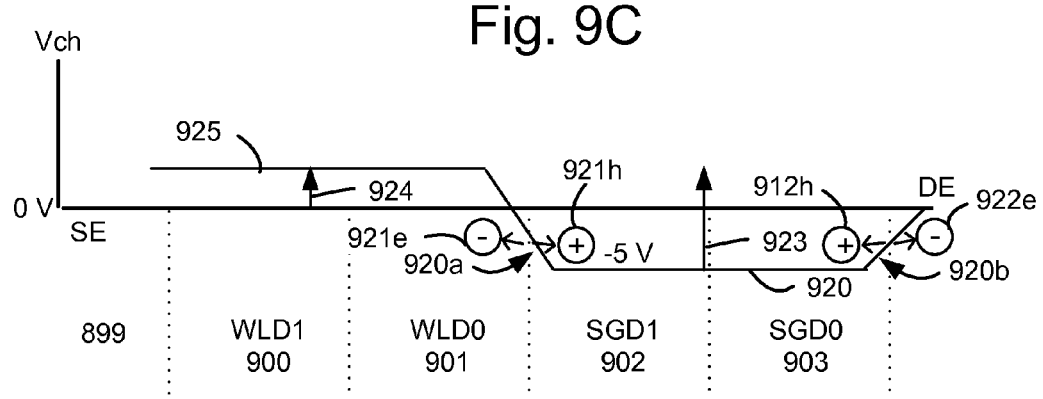
FIG. 9C depicts a plot of a channel voltage (Vch_unsel) of an unselected NAND string versus channel position, when a voltage of a select gate is stepped down while the dummy word lines and unselected word line are increasing, consistent with the time point t2a in FIG. 8B.

FIG. 9A to 9C provide further details regarding the channel of the unselected NAND string in the sensing process of FIG. 8A to 8F.

FIG. 9A depicts a plot of a channel voltage (Vch_unsel) of an unselected NAND string versus channel position, while a select gate is in a conductive state, consistent with the time interval t0a-t2a (plot 810) or t1a-t2a (plot 811) in FIG. 8B. The channel position depicts a region 899 which is directly under the data word lines and memory cells, a channel portion 900 which is directly under WLD1 and an associated memory cell, a channel portion 901 which is directly under WLD0 and an associated memory cell, a channel portion 902 which is directly under SGD1 and an associated select gate transistor, and a channel portion 903 which is directly under SGD0 and an associated select gate transistor. The channel positions depicted correspond to the portion 790 of ch_unsel in FIG. 7. For example, the data memory cells 745-767 may be directly over the channel portion 899, the dummy memory cell 744 may be directly over the channel portion 900, the dummy memory cell 743 may be directly over the channel portion 901, the select gate transistor 742 may be directly over the channel portion 902, and the select gate transistor 741 may be directly over the channel portion 903.

Assuming Vbl=0 V, the channel will be driven at 0 V when the SGD transistors are conductive.

FIG. 9B depicts a plot of a channel voltage (Vch_unsel) of an unselected NAND string versus channel position, when a voltage of a select gate is stepped down while the dummy word lines and unselected word line are in a steady state, consistent with the time point t2a in FIG. 8B. When the voltage steps down, the channel portion 902 decreases by the Vth of the SGD1 transistor to, e.g., −5 V (assuming Vth=5 V) represented by line 910. This creates a gradient 910a between the channel portions 901 and 902, and a gradient 910b at the drain-side edge of the channel portion 903. The gradient 910a generates electron-hole pairs as represented by an electron 911e and a hole 911h. The electrons can be drawn into the charge-trapping region of the dummy memory cell of WLD0 if the control gate-to-channel voltage of WLD0 is sufficiently high. Since the channel has been driven to 0 V or another low voltage, the control gate-to-channel voltage of WLD0 will be typically be low enough to avoid significant read disturb. Further, due to the use of a two-step increase in WLD0, the voltage on WLD0 will be at the relatively low first step up level when the select gate transistor voltage steps down.

The gradient 910b also generates electron-hole pairs as represented by an electron 911e and a hole 911h. However, this is less of a concern because there is no proximate memory cell.

In the time interval t3-t5, the holes which are generated tend to increase the local channel voltage as represented by the arrow 913. The time interval allows the channel portions to reach a steady state condition which is comparable to the plot of FIG. 9A.

FIG. 9C depicts a plot of a channel voltage (Vch_unsel) of an unselected NAND string versus channel position, when a voltage of a select gate transistor is stepped down while the dummy word lines and unselected word line are increasing, consistent with the time point t2a in FIG. 8B. As mentioned, a time interval between the step down of the select gate line voltage and the second step up of the dummy word line voltage allows time for the channel gradient under the dummy word line and select gate line to attenuate and stabilize. Another concern is that the channel portion under the dummy word line and select gate line is stable at the time of the step down of the voltage of the select gate transistor. For example, in FIGS. 8C and 8D, Vwld and Vwl_unsel should reach the steady state values of Vwld0a and Vwl_unsela, respectively at t2.

In FIGS. 9B and 9C, the line 920 is at a similar level as the line 910, the gradient 920b is similar to the gradient 910b and the hole 912h and electron 922e are similar to the hole 912h and electron 912e, respectively. However, since Vwld, in particular, has not reached the steady state value of Vwld0a when the select gate transistor of SGD1 becomes non-conductive, a portion of the increase of Vwld will cause capacitive coupling to the channel, raising the channel voltage as depicted by line 925 and arrow 924. A portion of the increase of Vwl_unsel will also cause capacitive coupling to the channel.

This results in the gradient 920a being larger than the gradient 910a, so that additional electron-hole pairs (such as electron 921e and hole 921h) will be generated and there is a greater likelihood of read disturb of the dummy memory cell of WLD0. In the time interval t2-t4, the holes which are generated tend to increase the local channel voltage as represented by the arrow 923. The time interval allows the channel portions to reach a steady state condition which is slightly higher than the level of FIG. 9A.

As mentioned in connection with FIGS. 6C and 6D, a number of factors influence read disturb of dummy memory cells, including the number of read cycles. FIG. 10A to 10F depict other factors which were analyzed.

Figure 10A:
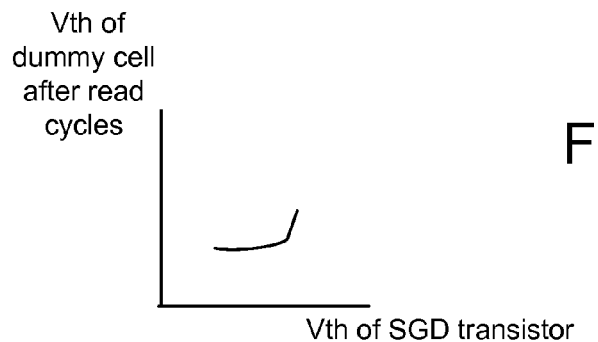
FIG. 10A depicts a plot of the increase in the Vth of a set of dummy memory cells after a number of read cycles for data memory cells, as a function of the Vth of associated select gate transistors.

FIG. 10A depicts a plot of the increase in the Vth of a set of dummy memory cells after a number of read cycles for data memory cells, as a function of the Vth of associated select gate transistors. As a design choice, the Vth of the SGD transistor can be set at a desired level. Generally, the Vth of the dummy memory cells after a specified number of read cycles have been performed increases sharply as the Vth of the SGD transistor increases. Referring to FIG. 9B, it can be seen that the gradient 910a is larger when the Vth of the SGD transistor is larger, at the time of the step down of the voltage of the SGD transistor. The line 910 will be lower when the Vth of the SGD transistor is larger. As a result, a guideline is that the Vth of the SGD transistor should not be unnecessarily high.

Figure 10B:
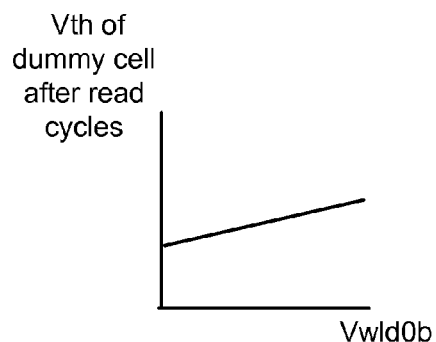
FIG. 10B depicts a plot of the increase in the Vth of a set of dummy memory cells after a number of read cycles for data memory cells, as a function of voltages on an associated dummy word line.

FIG. 10B depicts a plot of the increase in the Vth of a set of dummy memory cells after a number of read cycles for data memory cells, as a function of voltages on an associated dummy word line. As Vwld0b (the peak level of the dummy word line voltage) in FIG. 8C increases, the amount of read disturb increases. In this case, Vwld0a is constant, so that increasing Vwld0b causes a larger channel gradient that can cause HEI read disturb of the dummy memory cells. As a result, a guideline is that Vwld0b should be sufficiently high to provide the dummy memory cells in a strongly conductive state but not unnecessarily high.

Figure 10C:
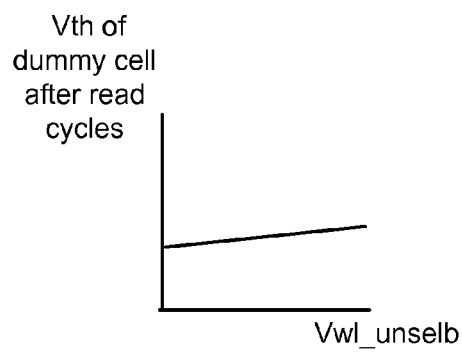
FIG. 10C depicts a plot of the increase in the Vth of a set of dummy memory cells after a number of read cycles for data memory cells, as a function of voltages on unselected word lines.

FIG. 10C depicts a plot of the increase in the Vth of a set of dummy memory cells after a number of read cycles for data memory cells, as a function of voltages on unselected word lines. As Vwl_unselb (the peak level of the unselected word line voltage) in FIG. 8D increases, the amount of read disturb increases. In this case, Vwl_unsela is constant, so that increasing Vwl_unselb causes a larger channel gradient that can cause HEI read disturb of the dummy memory cells. However, this increase is of secondary effect compared to the increase in Vwld0 in FIG. 10B. As a result, a guideline is that the Vth of the dummy memory cells should not be unnecessarily high.

Figure 10D:
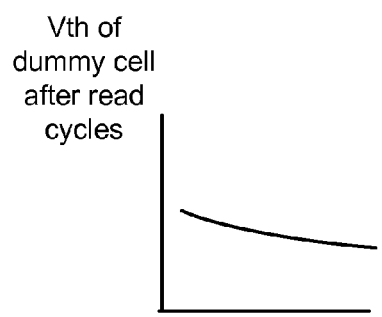
FIG. 10D depicts a plot of the increase in the Vth of a set of dummy memory cells after a number of read cycles for data memory cells, as a function of a time interval between a step down on a select gate voltage and a second step up of a dummy word line voltage, consistent with a time interval t2-t5 of FIG. 8C.

FIG. 10D depicts a plot of the increase in the Vth of a set of dummy memory cells after a number of read cycles for data memory cells, as a function of a time interval between a step down on a select gate voltage and a second step up of a dummy word line voltage, consistent with a time interval t2-t5 of FIG. 8C. As mentioned, this time interval should be sufficient to allow the channel gradient between SGD1 and WLD0 to attenuate and stabilize. The plot confirms that read disturb is lower when the time interval is longer.

Figure 10E:
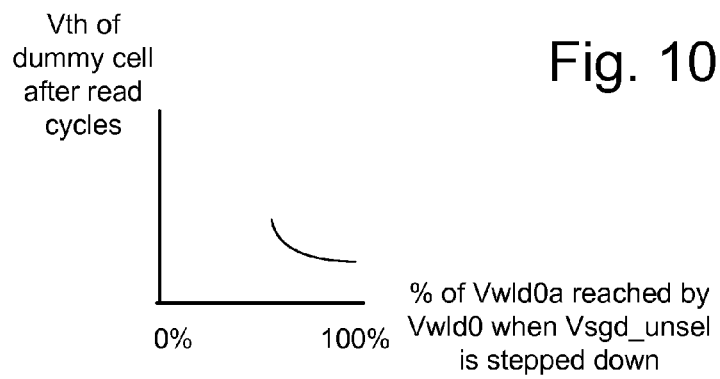
FIG. 10E depicts a plot of the increase in the Vth of a set of dummy memory cells after a number of read cycles for data memory cells, as a function of a value of a dummy word line voltage at a step down time of a select gate voltage, consistent with the plot 810 or 811 and the time point t2a of FIG. 8B and the plot 820a of FIG. 8C.

FIG. 10E depicts a plot of the increase in the Vth of a set of dummy memory cells after a number of read cycles for data memory cells, as a function of a value of a dummy word line voltage at a step down time of a select gate voltage, consistent with the plot 810 or 811 and the time point t2a of FIG. 8B and the plot 820a of FIG. 8C. As mentioned, sufficient time should be allowed for the dummy word line voltage to step up in the first step, before the step down time of the select gate voltage, to avoid coupling up of the channel voltage. The plot confirms that read disturb is lower when Vwld0 reaches 100% of Vwld0a in its first step up, before Vsgd_unsel is stepped down.

As a further note, read disturb of the dummy memory cells was relatively unaffected by the magnitude of the Vsg_ss or Vsgpk in FIG. 8C.

Figure 10F:
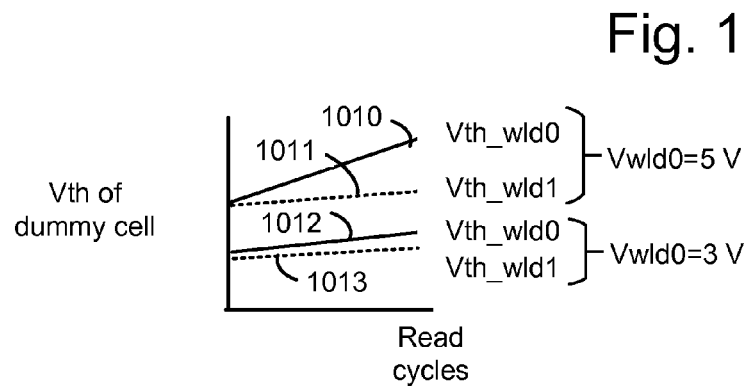
FIG. 10F depicts a plot of the increase in the Vth of a set of dummy memory cells as a function of an associated dummy word line voltage during sensing of data memory cells and as a function of a number of read cycles for the data memory cells.

FIG. 10F depicts a plot of the increase in the Vth of a set of dummy memory cells as a function of an associated dummy word line voltage during sensing of data memory cells and as a function of a number of read cycles for the data memory cells. As mentioned, the first and second steps of the dummy word line voltage, Vwld0a and Vwld0b, respectively, should be set to provide an adequate overdrive of the dummy memory cells while minimizing a difference between the two steps. This example is based on a single step up of Vwld0 to 3 V or 5 V. Plot 1012 shows the read disturb of the WLD0 dummy memory cells (e.g., the increase in Vth_wld0) as a function of read cycles when Vwld0=3 V. Plot 1013 shows the read disturb of the WLD1 dummy memory cells (e.g., the increase in Vth_wld1) as a function of read cycles when Vwld0=3 V. Plot 1010 shows the read disturb of the WLD0 dummy memory cells (e.g., the increase in Vth_wld0) as a function of read cycles when Vwld0=5 V. Plot 1011 shows the read disturb of the WLD1 dummy memory cells (e.g., the increase in Vth_wld1) as a function of read cycles when Vwld0=5 V. These plots confirm that read disturb is larger for WLD0 than WLD1, and that read disturb increases with read cycles. Further, the amount of read disturb is higher on WLD0 and WLD1 when the voltage on WLD0 is higher. Further, the read disturb increases at a faster rate with read cycles for WLD0 than for WLD1, and when Vwld0 is higher.

In summary, the read disturb of dummy memory cells on WLD0 occurs in unselected NAND strings, is worse when memory cells of the selected word line in the unselected NAND strings are programmed to a higher data state, is worse when the SGD transistor of the unselected NAND string has a higher Vth, is worse when WLD0 is higher, is worse when the step down of the select gate line voltage occurs before the unselected word line voltage and the dummy word line voltage have reached steady state after the first step up, is worse when the number of read cycles is higher, is worse than the read disturb of dummy memory cells on WLD1, and is better when more time is allowed between the step down of the select gate line voltage and the second step up of WLD0.

Figure 11A:
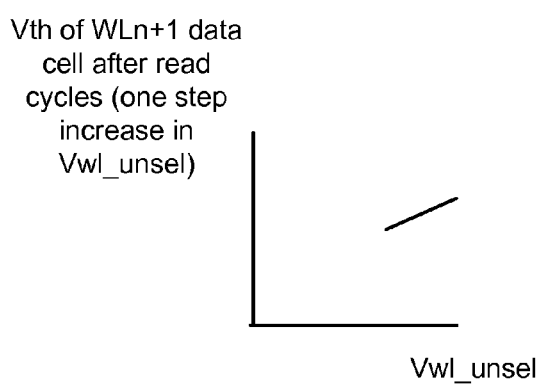
FIG. 11A depicts a plot of an increase in the Vth of data memory cells on a word line WLn+1 after a number of read cycles, as a function of a voltage on an unselected word line, where a one-step increase is provided for the voltage on the unselected word line.

FIG. 11A depicts a plot of an increase in the Vth of data memory cells on a word line WLn+1 after a number of read cycles, as a function of a voltage on an unselected word line (Vwl_unsel), where a one-step increase is provided for the voltage on the unselected word line. This case provides a Vwl_unsel which is similar to the plot 821 of FIG. 8C. For higher levels of Vwl_unsel, such as 9 V versus 8 V, the read disturb of the data memory cells on a word line WLn+1 increases quickly. This indicates that Vwl_unsel should be set carefully so that it is not too high, if a one-step increase in Vwl_unsel is used. Or, a two-step increase in Vwl_unsel can be used, as discussed next. As a guideline, Vwl_unsel should not be unnecessarily high.

Figure 11B:
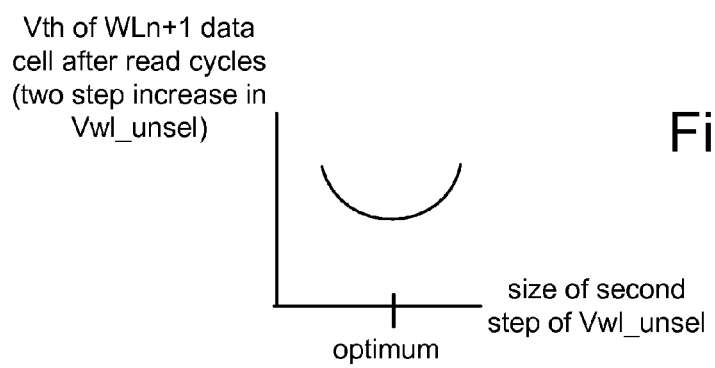
FIG. 11B depicts a plot of the Vth of data memory cells on a word line WLn+1 after a number of read cycles, as a function of a second voltage step up on an unselected word line.

FIG. 11B depicts a plot of the Vth of data memory cells on a word line WLn+1 after a number of read cycles, as a function of a second voltage step up on an unselected word line. An optimum step up for Vwl_unsel can be determined which minimizes the read disturb of the WLn+1 data memory cells. As mentioned, the use of a second step up of Vwl_unsel provides some capacitive coupling up of the channel which can the reduce F-N read disturb, which is proportional to the control gate-to-channel voltage. The control gate-to-channel voltage becomes smaller when the channel voltage is higher. If the second step is too high, HEI read disturb can increase. If the second step is too small, F-N read disturb can increase. The magnitude of the second step is Vwl_unselb-Vwl_unsela. As a guideline, the magnitude of the second step should be optimized to minimize HEI read disturb and F-N read disturb.

Figure 12A:
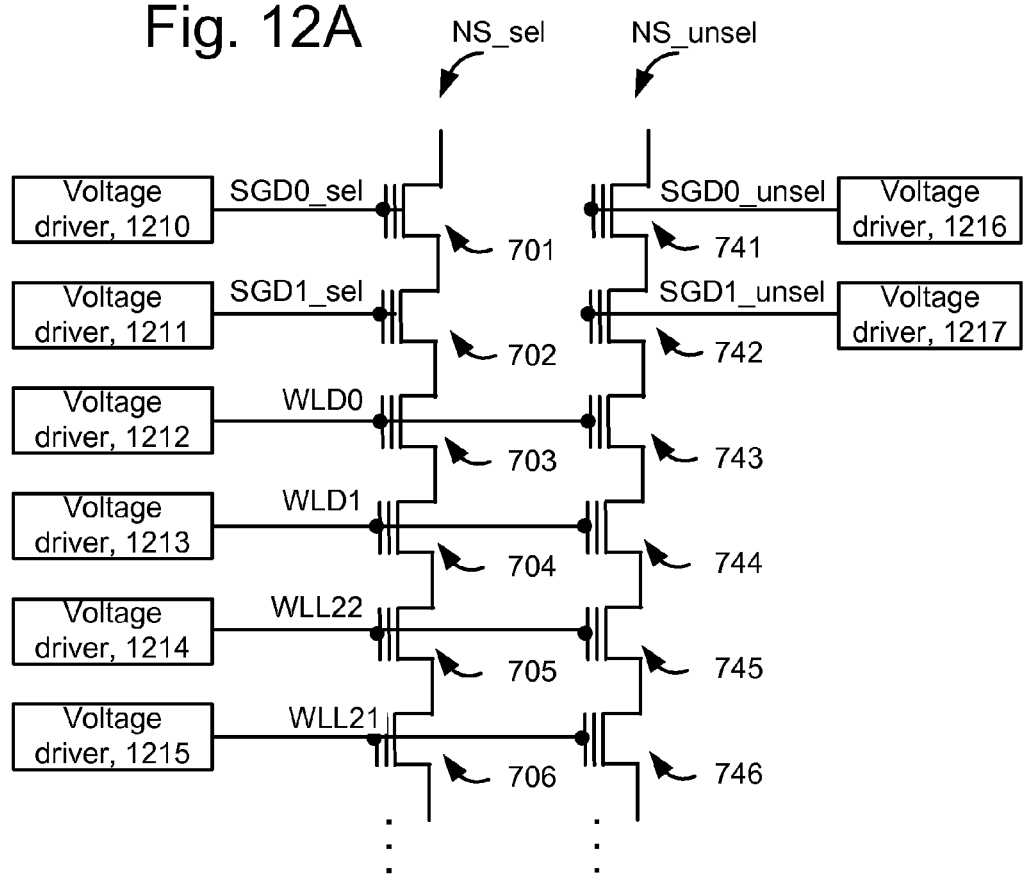
FIG. 12A depicts a circuit diagram comprising a drain-side portion of the example NAND strings NS_sel and NS_unsel of FIG. 7 and associated voltage drivers.

FIG. 12A depicts a circuit diagram comprising a drain-side portion of the example NAND strings NS_sel and NS_unsel of FIG. 7 and associated voltage drivers. A voltage driver 1210 provides a voltage on the select gate line SGD0_sel which is connected to the SGD transistor 701. A voltage driver 1211 provides a voltage on the select gate line SGD1_sel which is connected to the SGD transistor 702.

Similarly, a voltage driver 1216 provides a voltage on the select gate line SGD0_unsel which is connected to the SGD transistor 741, and a voltage driver 1217 provides a voltage on the select gate line SGD0_unsel which is connected to the SGD transistor 742.

A voltage driver 1212 provides a voltage on the word line WLD0 which is connected to the dummy memory cells 703 and 743. A voltage driver 1213 provides a voltage on the word line WLD1 which is connected to the dummy memory cells 704 and 744. A voltage driver 1214 provides a voltage on the word line WLD22 which is connected to the data memory cells 705 and 745. A voltage driver 1215 provides a voltage on the word line WLD21 which is connected to the data memory cells 706 and 746.

Further, as an example, WLL21 is the selected word line and WLL22 is an unselected word line, so that the voltage driver 1215 is for the selected word line and the voltage driver 1214 is for the unselected word line.

In this example, each word line is driven by a respective voltage driver. Other approaches are possible as well. For example, an additional common voltage driver may be connected to each word line to provide a common pass voltage for the unselected word lines. A transistor, not shown, can be provided for each word line to select either the common voltage driver or the respective voltage driver, in response to a control signal applied to a control gate of the transistor.

Figure 12B:
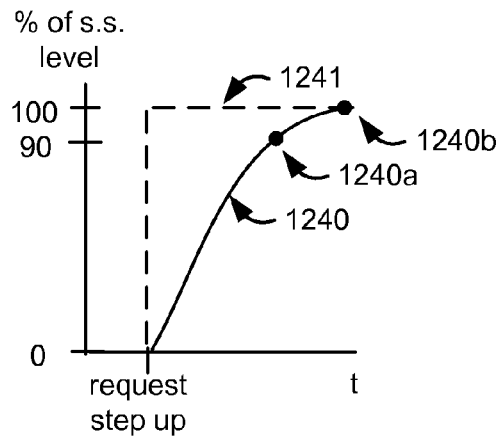
FIG. 12B depicts a plot of requested and actual outputs of a voltage driver versus time when a step up in voltage is requested by a controller.

FIG. 12B depicts a plot of requested and actual outputs of a voltage driver versus time when a step up in voltage is requested by a controller. A dashed line 1241 represents a requested voltage and a solid line 1240 represents an actual output voltage. Due to the resistance-capacitance (RC) time constant of the word line or select gate line which is being driven, a finite amount of time is needed for the output voltage to rise from an initial voltage to a requested voltage. Time points 1240*a* and 1240*b* represent times at which 90% and 100%, respectively, of the requested voltage (e.g., the steady state level) is reached.

Figure 12C:
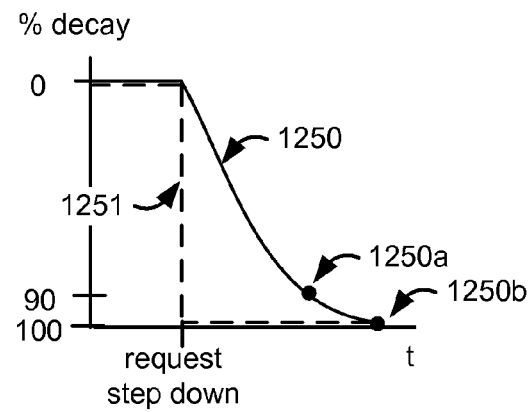
FIG. 12C depicts a plot of requested and actual outputs of a voltage driver versus time when a step down in voltage is requested by a controller.

FIG. 12C depicts a plot of requested and actual outputs of a voltage driver versus time when a step down in voltage is requested by a controller. A dashed line 1251 represents a requested voltage and a solid line 1250 represents an actual output voltage. Due to the time constant, a finite amount of time is needed for the output voltage to decay from an initial voltage to a requested voltage. Time points 1250*a* and 1250*b* represent times at which 90% and 100%, respectively, of the decay from the initial voltage has occurred.

Accordingly, it can be seen that, in one embodiment, a method for performing a sensing operation in a memory device (100) comprises: connecting a channel (ch_unsel) of an unselected NAND string (NS_unsel) in the memory device to a bit line (780) while the bit line is at a driven voltage (Vbl), wherein the bit line is connected to a selected NAND string (NS_sel), a select gate line (SGD1_sel) is connected to a drain-side select gate transistor (742) at a drain-side of the unselected NAND string and a drain-side select gate transistor (702) at a drain-side of the selected NAND string, a first dummy word line (WLD0) is connected to a first dummy memory cell (743) in the unselected NAND string adjacent to the drain-side select gate transistor of the unselected NAND string and to a first dummy memory cell (703) in the selected NAND string adjacent to the drain-side select gate transistor of the selected NAND string, a selected word line (WL21) is connected to a selected memory cell (706) in the selected NAND string and to a corresponding unselected memory cell (746) in the unselected NAND string, unselected word lines (WL0-WLL20, WLL22) are connected to unselected memory cells (727-707, 705) in the selected NAND string and to corresponding unselected memory cells (767-747, 745) in the unselected NAND string, and the connecting comprises requesting a voltage driver (1217) of the select gate line to provide a step up (Vsg_ss, Vsgpk) of a voltage (Vsg-d_unsel) on the select gate line, requesting a voltage driver (1212) of the first dummy word line to provide a first step up (Vwld0*a*) of a voltage (Vwld) on the first dummy word line, and requesting a voltage driver (1214) of the unselected word lines to provide a first step up (Vwl_unsela) of a voltage (Vwl_unsel) on the unselected word lines; after the connecting, disconnecting the channel of the unselected NAND string from the bit line, the disconnecting comprising requesting the voltage driver of the select gate line to provide a step down of the voltage on the select gate line; and while the channel of the unselected NAND string is disconnected from the bit line: (a) requesting the voltage driver of the unselected word lines to provide a second step up (Vwl_unselb) of the voltage of the unselected word lines, (b) requesting the voltage driver of the first dummy word line to provide a second step up (Vwld0*b*) of the voltage of the first dummy word line, (c) requesting a voltage driver (1215) of the selected word line to provide one or more voltages (VrEr/A, VrA/B, VrB/C; VvA, VvB, VvC) on the selected word line, and (d) sensing the selected memory cell while the selected word line is at the one or more voltages.

In another embodiment, a non-volatile memory device comprises: a selected NAND string comprising a drain-side select gate transistor at a drain-side of the selected NAND string, a first dummy memory cell adjacent to the drain-side select gate transistor of the selected NAND string, a selected memory cell and unselected memory cells; an unselected NAND string comprising a drain-side select gate transistor at a drain-side of the unselected NAND string, a first dummy memory cell adjacent to the drain-side select gate transistor of the unselected NAND string, an unselected memory cell corresponding to the selected memory cell and other unselected memory cells; a select gate line connected to the drain-side select gate transistor of the selected NAND string and the drain-side select gate transistor of the unselected NAND string; a first dummy word line connected to the first dummy memory cell of the selected NAND string and the first dummy memory cell of the unselected NAND string; a selected word line connected to the selected memory cell and the corresponding unselected memory cell; unselected word lines connected to the unselected memory cells of the selected NAND string and the other unselected memory cells of the unselected NAND string; a bit line connected to the selected NAND string and to the unselected NAND string; and a control circuit.

The control circuit is configured to: (a) provide one increase of a voltage on the select gate line, one increase of a voltage on the first dummy word line and one increase of voltages of the unselected word lines while the bit line is at a driven voltage; (b) subsequently provide a decrease of the voltage on the select gate line; (c) subsequently provide another increase of the voltage on the first dummy word line and another increase of the voltages of the unselected word lines; and (d) subsequently sense the selected memory cell while one or more voltages are provided on the selected word line.

In another embodiment, a memory controller comprises: a storage device comprising a set of instructions, and a processor operable to execute the set of instructions. The set of instructions comprising: instructions to connect a channel of an unselected NAND string to a bit line while the bit line is at a driven voltage, wherein the bit line is connected to a selected NAND string, a select gate line is connected to a drain-side select gate transistor at a drain-side of the unselected NAND string and a drain-side select gate transistor at a drain-side of the selected NAND string, a first dummy word line is connected to a first dummy memory cell in the unselected NAND string adjacent to the drain-side select gate transistor of the unselected NAND string and to a first dummy memory cell in the selected NAND string adjacent to the drain-side select gate transistor of the selected NAND string, a selected word line is connected to a selected memory cell in the selected NAND string and to a corresponding unselected memory cell in the unselected NAND string, unselected word lines are connected to unselected memory cells in the selected NAND string and to corresponding unselected memory cells in the unselected NAND string, and the instructions to connect comprise instructions to step up a voltage on the select gate line, step up a voltage on the first dummy word line, and step up a voltage on the unselected word lines; instructions to, after the connecting, disconnect the channel of the unselected NAND string from the bit line, the instructions to disconnect comprising instructions to step down the voltage on the select gate line; and instructions to, while the channel of the unselected NAND string is disconnected from the bit line, further step up the voltage of the first dummy word line, and subsequently sense the selected memory cell while one or more voltages are provided on the selected word line.

In another embodiment, a non-volatile memory device (100) comprises: a selected NAND string (NS_sel) comprising a channel (ch_sel), a drain-side select gate transistor (702) at a drain-side of the selected NAND string, a first dummy memory cell (703) adjacent to the drain-side select gate transistor of the selected NAND string, a selected memory cell (706) and unselected memory cells (727-707, 705); an unselected NAND string (NS_unsel) comprising a channel (ch_unsel), a drain-side select gate transistor (742) at a drain-side of the unselected NAND string, a first dummy memory cell (743) adjacent to the drain-side select gate transistor of the unselected NAND string, an unselected memory cell (746) corresponding to the selected memory cell and other unselected memory cells (767-747); a select gate line (SGD1_sel) connected to the drain-side select gate transistor of the selected NAND string and the drain-side select gate transistor of the unselected NAND string; a first dummy word line (WLD0) connected to the first dummy memory cell of the selected NAND string and the first dummy memory cell of the unselected NAND string; a selected word line (WLL21) connected to the selected memory cell and the corresponding unselected memory cell; unselected word lines (WL0-WLL20, WLL22) connected to the unselected memory cells of the selected NAND string and the other unselected memory cells of the unselected NAND string; a bit line (780) connected to the selected NAND string and to the unselected NAND string; and a control circuit (110, 112, 114, 116, 122, 128, 132, 192, SB1, SB2, . . . , SBp, MC0). The control circuit is configured to: connect the channel of the unselected NAND string to the bit line while the bit line is at a driven voltage.

Moreover, the control circuit, to connect the channel, is configured to: (a) request a voltage driver (1217) of the select gate line to provide a step up (Vsg_ss, Vsg_pk) of a voltage (Vsgd_unsel) on the select gate line; (b) request a voltage driver (1212) of the first dummy word line to provide a first step up (Vwld0a) of a voltage (Vwld) on the first dummy word line; and (c) request a voltage driver (1214) of the unselected word lines to provide a first step up (Vwl_unsela) of a voltage (Vwl_unsel) on the unselected word lines. The control circuit is also configured to: disconnect the channel of the unselected NAND string from the bit line, wherein the control circuit, to disconnect the channel, is configured to: (d) request the voltage driver of the select gate line to provide a step down of the voltage on the select gate line; and (e) while the channel of the unselected NAND string is disconnected from the bit line: (i) request the voltage driver of the unselected word lines to provide a second step up (Vwl_unselb) of the voltage of the unselected word lines; (ii) request the voltage driver of the first dummy word line to provide a second step up (Vwld0b) of the voltage of the first dummy word line; (iii) request a voltage driver (1215) of the selected word line to provide one or more voltages (VrEr/A, VrA/B, VrB/C; VvA, VvB, VvC) on the selected word line; and (iv) sense the selected memory cell while the selected word line is at the one or more voltages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing a sensing operation in a memory device, the method comprising:
   connecting a channel of an unselected NAND string in the memory device to a bit line while the bit line is at a driven voltage, wherein the bit line is connected to a selected NAND string, a select gate line is connected to a drain-side select gate transistor at a drain-side of the unselected NAND string and a drain-side select gate transistor at a drain-side of the selected NAND string, a first dummy word line is connected to a first dummy memory cell in the unselected NAND string adjacent to the drain-side select gate transistor of the unselected NAND string and to a first dummy memory cell in the selected NAND string adjacent to the drain-side select gate transistor of the selected NAND string, a selected word line is connected to a selected memory cell in the selected NAND string and to a corresponding unselected memory cell in the unselected NAND string, unselected word lines are connected to unselected memory cells in the selected NAND string and to corresponding unselected memory cells in the unselected NAND string, and the connecting comprises requesting a voltage driver of the select gate line to provide a step up of a voltage on the select gate line, requesting a voltage driver of the first dummy word line to provide a first step up of a voltage on the first dummy word line, and requesting a voltage driver of the unselected word lines to provide a first step up of a voltage on the unselected word lines;
   after the connecting, disconnecting the channel of the unselected NAND string from the bit line, the disconnecting comprising requesting the voltage driver of the select gate line to provide a step down of the voltage on the select gate line; and
   while the channel of the unselected NAND string is disconnected from the bit line:
      requesting the voltage driver of the unselected word lines to provide a second step up of the voltage of the unselected word lines,
      requesting the voltage driver of the first dummy word line to provide a second step up of the voltage of the first dummy word line,
      requesting a voltage driver of the selected word line to provide one or more voltages on the selected word line, and
      sensing the selected memory cell while the selected word line is at the one or more voltages.

2. The method of claim 1, wherein:
   the second step up of the voltage on the first dummy word line occurs after the second step up of the voltage on the unselected word lines.

3. The method of claim 2, wherein:
   a time interval between the second step up of the voltage on the first dummy word line and the second step up of the voltage on the unselected word lines is at least as long as a time interval in which the channel of the unselected NAND string is connected to the bit line during the connecting.

4. The method of claim 3, wherein:
the time interval in which the channel of the unselected NAND string is connected to the bit line during the connecting is a time interval in which a control gate-to-drain voltage of the drain-side select gate transistor of the drain-side of the unselected NAND string exceeds a threshold voltage of the drain-side select gate transistor of the drain-side of the unselected NAND string.

5. The method of claim 1, wherein:
the step up of the voltage on the select gate line occurs concurrently with the first step up of the voltage on the first dummy word line and the first step up of the voltage on the unselected word lines.

6. The method of claim 1, wherein:
the step up of the voltage on the select gate line occurs before the first step up of the voltage on the first dummy word line and the first step up of the voltage on the unselected word lines.

7. The method of claim 1, wherein:
a time interval between the step up of the voltage of the select gate line and the step down of the voltage of the select gate line is insufficient for the voltage of the select gate line to reach a steady state voltage.

8. The method of claim 1, wherein:
a level of the first step up of the voltage on the first dummy word line and a level of the second step up of the voltage on the first dummy word line increase periodically over a lifetime of the memory device.

9. The method of claim 1, further comprising:
measuring an increase in a threshold voltage distribution of a set of dummy memory cells connected to the first dummy word line; and
increasing a level of the first step up of the voltage on the first dummy word line and a level of the second step up of the voltage on the first dummy word line in response to the measuring.

10. The method of claim 1, wherein:
a second dummy word line is connected to a second dummy memory cell in the unselected NAND string and to a second dummy memory cell in the selected NAND string;
the second dummy word line in the unselected NAND string is adjacent to the first dummy memory cell of the unselected NAND string;
the second dummy word line in the selected NAND string is adjacent to the first dummy memory cell of the selected NAND string;
threshold voltages of the second dummy memory cell of the unselected NAND string and the second dummy memory cell of the selected NAND string are higher than threshold voltages of the first dummy memory cell of the unselected NAND string and the first dummy memory cell of the selected NAND string;
the connecting comprises requesting a voltage driver of the second dummy word line to provide a first step up of a voltage on the second dummy word line concurrent with the first step up of the voltage on the first dummy word line; and
while the channel of the unselected NAND string is disconnected from the bit line, requesting the voltage driver of the second dummy word line to provide a second step up of the voltage of the second dummy word line concurrent with the second step up of the voltage on the first dummy word line.

11. A non-volatile memory device, comprising:
a selected NAND string comprising a drain-side select gate transistor at a drain-side of the selected NAND string, a first dummy memory cell adjacent to the drain-side select gate transistor of the selected NAND string, a selected memory cell and unselected memory cells;
an unselected NAND string comprising a drain-side select gate transistor at a drain-side of the unselected NAND string, a first dummy memory cell adjacent to the drain-side select gate transistor of the unselected NAND string, an unselected memory cell corresponding to the selected memory cell and other unselected memory cells;
a select gate line connected to the drain-side select gate transistor of the selected NAND string and the drain-side select gate transistor of the unselected NAND string;
a first dummy word line connected to the first dummy memory cell of the selected NAND string and the first dummy memory cell of the unselected NAND string;
a selected word line connected to the selected memory cell and the corresponding unselected memory cell;
unselected word lines connected to the unselected memory cells of the selected NAND string and the other unselected memory cells of the unselected NAND string;
a bit line connected to the selected NAND string and to the unselected NAND string; and
a control circuit, the control circuit is configured to:
provide one increase of a voltage on the select gate line, one increase of a voltage on the first dummy word line and one increase of voltages of the unselected word lines while the bit line is at a driven voltage;
subsequently provide a decrease of the voltage on the select gate line;
subsequently provide another increase of the voltage on the first dummy word line and another increase of the voltages of the unselected word lines; and
subsequently sense the selected memory cell while one or more voltages are provided on the selected word line.

12. The non-volatile memory device of claim 11, wherein:
the another increase of the voltage on the first dummy word line is after the another increase of the voltages of the unselected word lines.

13. The non-volatile memory device of claim 11, wherein:
the first dummy memory cell of the unselected NAND string comprises a charge-trapping layer.

14. The non-volatile memory device of claim 11, further comprising:
a channel in the unselected NAND string extending continuously directly under the first dummy memory cell of the unselected NAND string and directly under the drain-side select gate transistor of the unselected NAND string.

15. The non-volatile memory device of claim 11, wherein:
the select gate line extends above the first dummy word line; and
the first dummy word line extends above the selected word line and the unselected word lines.

16. A memory controller, comprising:
a storage device comprising a set of instructions; and
a processor operable to execute the set of instructions, the set of instructions comprising:
instructions to connect a channel of an unselected NAND string to a bit line while the bit line is at a driven voltage, wherein the bit line is connected to a selected NAND string, a select gate line is connected to a drain-side select gate transistor at a drain-side of the unselected NAND string and a drain-side select gate transistor at a drain-side of the selected NAND string, a first dummy word line is connected to a first dummy memory cell in the unselected NAND string adjacent to the drain-side select gate transistor of the unselected NAND string and to a first dummy memory cell in the selected NAND string adjacent to the drain-side select gate transistor of the selected NAND string, a selected word line is connected to a selected memory cell in the selected NAND string and to a corresponding unselected memory cell in the unselected NAND string, unselected word lines are connected to unselected memory cells in the selected NAND string and to corresponding unselected memory cells in the unselected NAND string, and the instructions to connect comprise instructions to step up a voltage on the select gate line, step up a voltage on the first dummy word line, and step up a voltage on the unselected word lines;

instructions to, after the connecting, disconnect the channel of the unselected NAND string from the bit line, the instructions to disconnect comprising instructions to step down the voltage on the select gate line; and instructions to, while the channel of the unselected NAND string is disconnected from the bit line, further step up the voltage of the first dummy word line, and subsequently sense the selected memory cell while one or more voltages are provided on the selected word line.

17. The memory controller of claim 16, further comprising:

instructions to, while the channel of the unselected NAND string is disconnected from the bit line, further step up the voltage of the unselected word lines, before the sensing.

18. The memory controller of claim 16, wherein:

the further step up of the voltage of the first dummy word line is after the further step up of the voltage of the unselected word lines.

19. The memory controller of claim 16, further comprising:

instructions to ground the selected word line during the connecting; and instructions to step up a voltage of the selected word line after the stepping down the voltage on the select gate line.

20. The memory controller of claim 16, wherein:

the further step up of the voltage of the first dummy word line is concurrent with the further step up of the voltage of the unselected word lines.

* * * * *